US012563916B2

(12) United States Patent
Bok et al.

(10) Patent No.: US 12,563,916 B2
(45) Date of Patent: Feb. 24, 2026

(54) DISPLAY DEVICE INCLUDING CONNECTED CATHODES WITH PERIOD-BASED POWER AND DRIVING SIGNALS AND AN ELECTRONIC DEVICE HAVING THE SAME

(71) Applicant: Samsung Display Co., Ltd., Yongin-Si (KR)

(72) Inventors: Seung-Lyong Bok, Hwaseong-si (KR); Dongho Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 665 days.

(21) Appl. No.: 17/747,039

(22) Filed: May 18, 2022

(65) Prior Publication Data

US 2023/0067816 A1 Mar. 2, 2023

(30) Foreign Application Priority Data

Sep. 1, 2021 (KR) ......................... 10-2021-0116041

(51) Int. Cl.
| | |
|---|---|
| *H10K 59/131* | (2023.01) |
| *G06V 40/13* | (2022.01) |
| *H10K 50/16* | (2023.01) |
| *H10K 59/121* | (2023.01) |
| *H10K 59/40* | (2023.01) |
| *H10K 59/65* | (2023.01) |

(Continued)

(52) U.S. Cl.
CPC ....... *H10K 59/131* (2023.02); *G06V 40/1306* (2022.01); *H10K 50/16* (2023.02); *H10K 59/1213* (2023.02); *H10K 59/40* (2023.02);

*H10K 59/65* (2023.02); *H10K 59/80521* (2023.02); *H10K 2102/101* (2023.02)

(58) Field of Classification Search
CPC .............. G06V 40/1306; H10K 50/16; H10K 59/1213; H10K 2102/101
See application file for complete search history.

(56) References Cited

U.S. PATENT DOCUMENTS

| | | | |
|---|---|---|---|
| 8,796,702 | B2 | 8/2014 | Kim et al. |
| 8,872,206 | B2 | 10/2014 | Chung et al. |
| 10,042,495 | B2 | 8/2018 | Yang et al. |

(Continued)

FOREIGN PATENT DOCUMENTS

| | | |
|---|---|---|
| CN | 110379356 | 10/2019 |
| CN | 111666001 | 9/2020 |

(Continued)

*Primary Examiner* — Fernando L Toledo
*Assistant Examiner* — Ryan T. Fortin
(74) *Attorney, Agent, or Firm* — F. CHAU & ASSOCIATES, LLC

(57) ABSTRACT

A display device includes a first area and a second area adjacent to the first area. A light emitting element may be disposed on the first area, and a pixel circuit connected to the light emitting element may be disposed on the second area. The first area includes a low transmittance area overlapping a cathode of a first pixel and a cathode of a second pixel and a high transmittance area that does not overlap the cathode of the first pixel and the cathode of the second pixel. Each of the cathode of the first pixel and the cathode of the second pixel receives a power voltage having a constant level during a first period and receives a driving signal during a second period.

24 Claims, 30 Drawing Sheets

(51) Int. Cl.
    *H10K 59/80*        (2023.01)
    *H10K 102/10*      (2023.01)

(56)            References Cited

U.S. PATENT DOCUMENTS

| | | | |
|---|---|---|---|
| 10,185,430 B2 | 1/2019 | Zhu et al. | |
| 10,845,934 B2 | 11/2020 | Feng | |
| 11,094,772 B2 | 8/2021 | Ma et al. | |
| 11,114,523 B2 | 9/2021 | Park et al. | |
| 2012/0104422 A1 | 5/2012 | Lee et al. | |
| 2014/0145156 A1 | 5/2014 | Choi et al. | |
| 2018/0356922 A1 | 12/2018 | Liu et al. | |
| 2020/0105843 A1* | 4/2020 | Baek | H10K 59/352 |
| 2020/0176657 A1* | 6/2020 | Jang | H10K 59/131 |
| 2020/0312927 A1* | 10/2020 | Bae | H10K 59/123 |
| 2020/0343312 A1* | 10/2020 | Ryu | H10K 59/8792 |
| 2020/0394381 A1* | 12/2020 | Ryu | G09G 3/20 |
| 2021/0057494 A1* | 2/2021 | Chung | H10K 50/818 |
| 2021/0097252 A1* | 4/2021 | Lee | G06F 3/041 |
| 2021/0134927 A1 | 5/2021 | Kim et al. | |
| 2021/0200366 A1* | 7/2021 | Bok | G06V 10/17 |
| 2021/0241671 A1* | 8/2021 | Lee | G09G 3/3225 |
| 2021/0408151 A1* | 12/2021 | Choi | H10K 59/121 |
| 2022/0122535 A1* | 4/2022 | Jung | H10K 59/1213 |

FOREIGN PATENT DOCUMENTS

| | | | | |
|---|---|---|---|---|
| CN | 111710276 | 9/2020 | | |
| KR | 10-2011-0103735 A | 9/2011 | | |
| KR | 10-2012-0134464 A | 12/2012 | | |
| KR | 10-2021-0052749 | 5/2021 | | |
| KR | 10-2705173 B1 | 9/2024 | | |
| WO | WO-2021118082 A1 * | 6/2021 | | H01L 25/0753 |
| WO | WO-2021157923 A1 * | 8/2021 | | H01L 27/32 |

* cited by examiner

1

DISPLAY DEVICE INCLUDING CONNECTED CATHODES WITH PERIOD-BASED POWER AND DRIVING SIGNALS AND AN ELECTRONIC DEVICE HAVING THE SAME

CROSS-REFERENCE TO RELATED APPLICATION

This U.S. non-provisional patent application claims priority under 35 U.S.C. § 119 to Korean Patent Application No. 10-2021-0116041, filed on Sep. 1, 2021, the disclosure of which is incorporated by reference herein in its entirety.

TECHNICAL FIELD

The present disclosure relates to a display device including a display area through which an optical signal is transmitted and an electronic device including the same.

DISCUSSION OF RELATED ART

An electronic device such as a smartphone may include various electronic components such as a display panel and an electronic module. The electronic module may include a camera, an infrared detection sensor, or a proximity sensor. The electronic module may be disposed below the display panel. The display panel may include an area to expose the electronic module to the outside. A partial area of the display panel may have a transmittance greater than that of another partial area of the display panel. The electronic module may thus be located at the area having a high transmittance to receive or output an optical signal therethrough.

SUMMARY

The present disclosure provides a display device in which a sensing area has an increased transmittance.

The present disclosure also provides an electronic device including the display device.

An embodiment of the inventive concept provides, a display device comprising: a display panel comprising: a base layer comprising a display area comprising a first area through which an optical signal passes and a second area disposed adjacent to the first area and configured to block the optical signal, and a peripheral area disposed adjacent to the display area; and a first group pixel and a second group pixel disposed on the base layer, wherein the first group pixel comprises a first pixel and a second pixel, each of the first pixel and the second pixel comprises a first light emitting element disposed on the first area and a first pixel circuit electrically connected to the first light emitting element and disposed on the second area or the peripheral area, the first light emitting element comprises an anode, a light emitting layer disposed on the anode, and a cathode disposed on the light emitting layer, the cathode of the first pixel and the cathode of the second pixel are electrically connected, the first area comprises a low transmittance area overlapping the cathode of the first pixel and the cathode of the second pixel and a high transmittance area that does not overlap the cathode of the first pixel and the cathode of the second pixel, and each of the cathode of the first pixel and the cathode of the second pixel receives a power voltage during a first period and receives a driving signal during a second period.

The second group pixel comprises a second light emitting element disposed on the second area and a second pixel circuit electrically connected to the second light emitting element and disposed on the second area, the second light emitting element comprises an anode, a light emitting layer disposed on the anode, and a cathode disposed on the light emitting layer, and the cathode of the second light emitting element and the cathode of the first light emitting element are electrically connected to each other.

The cathode of the second light emitting element and the cathode of the first light emitting element have an integrated shape.

The cathode of the first light emitting element and the cathode of the second light emitting element have an integrated shape.

The first light emitting element further comprises an electron transport layer disposed between the light emitting layer and the cathode, and the electron transport layer overlaps the low transmittance area and does not overlap the high transmittance area.

The display panel further comprises a cathode connection line configured to connect the cathode of the first light emitting element and the cathode of the second light emitting element, and the cathode connection line comprises a transparent conductive oxide and overlaps the high transmittance area.

The display panel further comprises a signal line configured to provide the power voltage and the driving signal to the cathode of the first light emitting element.

The signal line comprises: a first portion overlapping the first area and comprising a transparent conductive oxide; and a second portion overlapping the second area, connected with the first portion, and comprising metal.

The first pixel circuit comprises a transistor electrically connected to a data line, and the second portion comprises the same material as the data line and is disposed on the same layer as the data line.

The display panel further comprises a pixel connection line configured to connect the first light emitting element and the first pixel circuit, and the first portion comprises the same material as the pixel connection line and is disposed on the same layer as the pixel connection line.

The display panel further comprises an organic layer configured to expose the anode of the first pixel, and the cathode of the first pixel is disposed on the organic layer and connected to the first portion through a first contact hole passing through the organic layer.

The first portion and the second portion are disposed on different layers with an insulation layer therebetween, and the first portion and the second portion are connected through a second contact hole passing through the insulation layer.

Each of the first pixel and the second pixel further comprises a copy light emitting element electrically connected with the first light emitting element, the copy light emitting element comprises an anode, a light emitting layer disposed on the anode, and a cathode disposed on the light emitting layer, the cathode of the first light emitting element of the first pixel and the cathode of the copy light emitting element of the second pixel have an integrated shape, and the cathode of the first light emitting element of the second pixel and the cathode of the copy light emitting element of the first pixel have an integrated shape.

The display panel further comprises: a first connection line configured to connect the anode of the first light emitting element of the first pixel and the anode of the copy light emitting element of the first pixel; and a second connection line configured to connect the anode of the first light emitting element of the second pixel and the anode of the copy light emitting element of the second pixel, and the first connection line and the second connection line cross each other and are disposed on different layers.

Each of the first connection line and the second connection line comprises a transparent conductive oxide, and a portion of each of the first connection line and the second connection line overlaps the high transmittance area.

The base layer further comprises a third area disposed between the peripheral area and the second area, the display panel further comprises a third group pixel disposed on the third area, the third group pixel comprises a third light emitting element disposed on the third area and a third pixel circuit electrically connected to the third light emitting element and disposed on the third area, the third light emitting element comprises an anode, a light emitting layer disposed on the anode, and a cathode disposed on the light emitting layer, and the cathode of the third light emitting element receives the power voltage during the first period and the driving signal during the third period.

The third group pixel comprises a third pixel and a fourth pixel, the cathode of the third pixel is electrically connected with the cathode of the first pixel, and the cathode of the fourth pixel is electrically separated from the cathode of the first pixel.

The display device further comprises a sensor disposed on the display panel, wherein the display panel further comprises an encapsulation layer configured to cover the first light emitting element, and the sensor is disposed on the encapsulation layer.

The sensor comprises an antenna pattern.

The base layer further comprises a third area disposed between the peripheral area and the second area, the display panel further comprises a third group pixel disposed on the third area, the third group pixel comprises a third light emitting element disposed on the third area and a third pixel circuit electrically connected to the third light emitting element and disposed on the third area, the third light emitting element comprises an anode, a light emitting layer disposed on the anode, and a cathode disposed on the light emitting layer, the antenna pattern overlaps the third area, and a distance between the antenna pattern and the cathode of the third light emitting element is equal to or greater than about 150 μm.

The sensor comprises a fingerprint sensing pattern, and the fingerprint sensing pattern has a width of about 50 μm to about 150 μm.

The base layer further comprises a third area disposed between the peripheral area and the second area, the display panel further comprises a third group pixel disposed on the third area, the sensor comprises a sensing pattern of an input sensor, the sensing pattern of the input sensor comprises: a first sensing pattern overlapping the third area; and a second sensing pattern that does not overlap the first area, overlaps the second area, and has an area less than that of the first sensing pattern.

Each of the first sensing pattern and the second sensing pattern comprises a conductive line configured to form a plurality of openings, and the conductive line of the second sensing pattern has a line width greater than that of the conductive line of the first sensing pattern.

An embodiment of the inventive concept provides an electronic device comprising: a display device comprising a base layer comprising a display area comprising a first area through which an optical signal passes and a second area disposed adjacent to the first area and configured to block the optical signal and a peripheral area disposed adjacent to the display area, and a pixel disposed on the base layer; and an electronic optical module disposed below the display device, overlapping the first area, and configured to receive the optical signal passing through the first area, wherein the pixel comprises a plurality of first pixels, each of the plurality of first pixels comprises a light emitting element disposed on the first area and a pixel circuit electrically connected to the light emitting element and disposed on the second area or the peripheral area, the light emitting element comprises an anode, a light emitting layer disposed on the anode, and a cathode disposed on the light emitting layer, the cathodes of the plurality of first pixels are electrically connected, and the first area comprises a low transmittance area overlapping the cathode of the plurality of first pixels and a high transmittance area that does not overlap the cathode of each of the plurality of first pixels.

An embodiment of the inventive concept provides an electronic device comprising: a display device comprising a base layer comprising a display area comprising a first area and a second area disposed adjacent to the first area and a peripheral area disposed adjacent to the display area and a pixel disposed on the base layer; and an electronic optical module disposed below the display device, overlapping the first area, and configured to receive an optical signal passing through the first area, wherein the pixel comprises a first pixel and a second pixel, each of the first pixel and the second pixel comprises a first light emitting element disposed on the first area and a first pixel circuit electrically connected to the first light emitting element and disposed on the second area or the peripheral area, the first light emitting element comprises an anode, a light emitting layer disposed on the anode, and a cathode disposed on the light emitting layer, the cathode of the first pixel and the cathode of the second pixel are electrically connected, the first area comprises a low transmittance area overlapping the cathode of the first pixel and the cathode of the second pixel and a high transmittance area that does not overlap the cathode of the first pixel and the cathode of the second pixel, and each of the cathode of the first pixel and the cathode of the second pixel receives a power voltage having a constant level during a first period and a driving signal during a second period.

BRIEF DESCRIPTION OF THE FIGURES

The above and other features of the inventive concept will become apparent by describing in detail embodiments thereof with reference to the accompanying drawings. In the drawings.

DETAILED DESCRIPTION OF THE EMBODIMENTS

Figure 1:
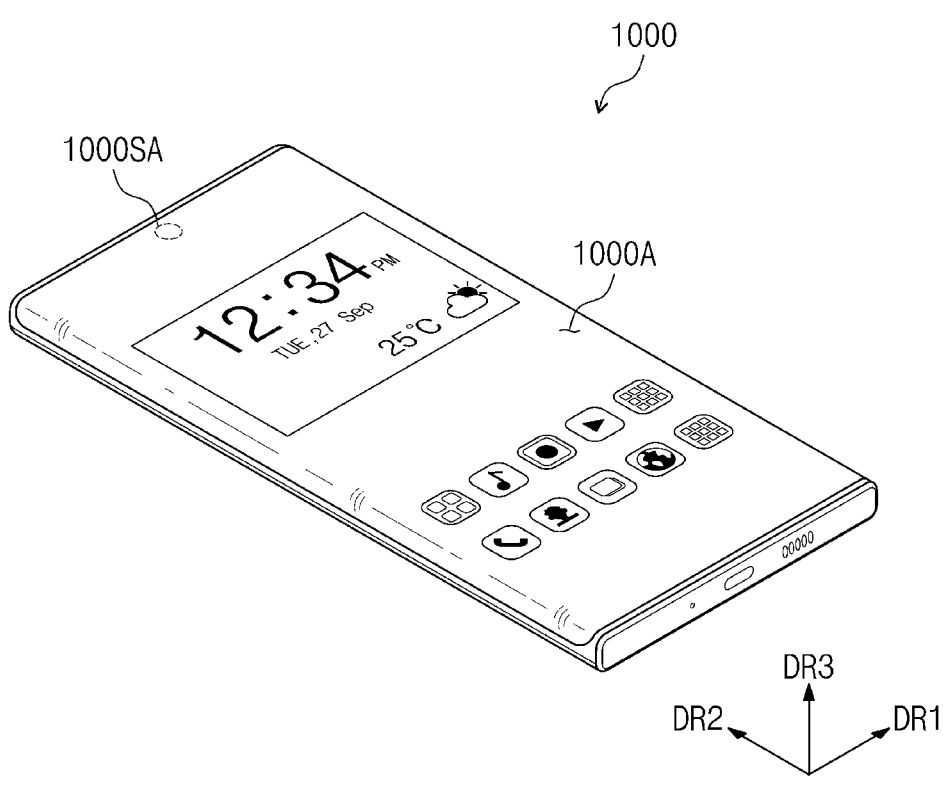
FIG. 1 is a perspective view illustrating an electronic device according to an embodiment of the inventive concept.

In this specification, it will be understood that when a component (or region, layer, portion) is referred to as being 'on', 'connected to', or 'coupled to' another component, it can be directly disposed/connected/coupled on/to the other component, or an intervening third component may be present.

Like reference numerals may refer to like elements throughout the specification. In addition, in the figures, the thickness, ratio, and dimensions of components may be exaggerated for clarity of illustration. As used herein, the term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless otherwise specified.

In addition, spatially relative terms, such as "below", "lower", "above", and "upper", may be used herein for ease of description to describe an element and/or a feature's relationship to another element(s) and/or feature(s) as illustrated in the drawings. These terms may be a relative concept and described based on directions expressed in the drawings.

The meaning of 'include' or 'comprise' may specify a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined in the description, such terms should not be interpreted in an idealized or overly formal sense.

Hereinafter, embodiments of the inventive concept will be described with reference to the accompanying drawings.

FIG. 1 is a perspective view illustrating an electronic device 1000 according to an embodiment of the inventive concept.

Referring to FIG. 1, the electronic device 1000 is a mobile phone as an example in this embodiment. However, the inventive concept is not limited thereto. For example, the electronic device 1000 may be a tablet computer, a monitor, a television, a vehicle navigation unit, a game console, or a wearable device.

The electronic device 1000 may display an image through a display area 1000A. The display area 1000A may include a plane defined by a first directional axis DR1 and a second directional axis DR2. The first directional axis DR1 may hereinafter be referred to as a first direction and the second directional axis DR2 may hereinafter be referred to as a second direction. The display area 1000A may further include curved surfaces that are respectively bent from at least two sides of the plane. However, the inventive concept is not limited to the shape of the display area 1000A. For example, the display area 1000A may include only the plane or further include at least two curved surfaces of the plane, e.g., four curved surfaces respectively bent from four sides of the plane.

The display area 1000A may have a partial area that is a sensing area 1000SA. Although one sensing area 1000SA is illustrated as an example, the inventive concept is not limited to one sensing area 1000SA. For example, two or more sensing areas may be provided. The sensing area 1000SA may be a portion of the display area 1000A, but may have a transmittance greater than that of the other areas of the display area 1000A. Thus, the sensing area 1000SA may transmit an optical signal therethrough while displaying an image.

The electronic device 1000 may include an electronic optical module disposed on an area overlapping the sensing area 1000SA. The electronic optical module may receive an optical signal provided from the outside through the sensing area 1000SA or output an optical signal through the sensing area 1000SA. For example, the electronic optical module may be a camera module, a sensor for measuring a distance between an object and a mobile phone such as a proximity sensor, a sensor for recognizing a portion of a user's body (e.g., a fingerprint, an iris, or a face), or a small-sized lamp for emitting light. However, the inventive concept is not limited thereto.

A thickness direction of the electronic device 1000 may be a third direction DR3 that is a normal direction of the display area 1000A. Here, a front surface (or a top surface) and a rear surface (or a bottom surface) of each of members of the electronic device 1000 may be defined based on the third direction DR3.

Figure 2A:
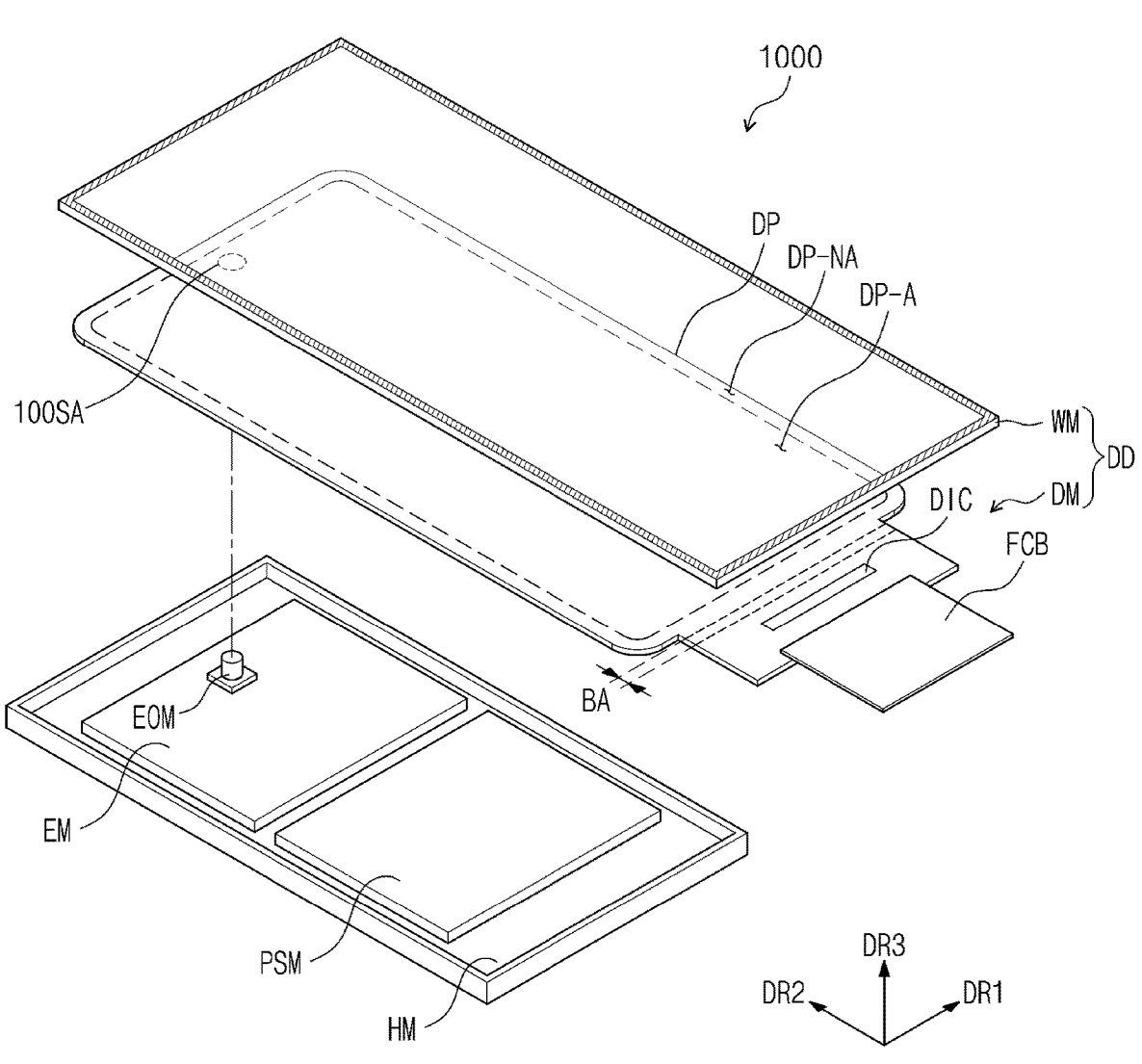
FIG. 2A is an exploded perspective view illustrating the electronic device according to an embodiment of the inventive concept.
Figure 2B:
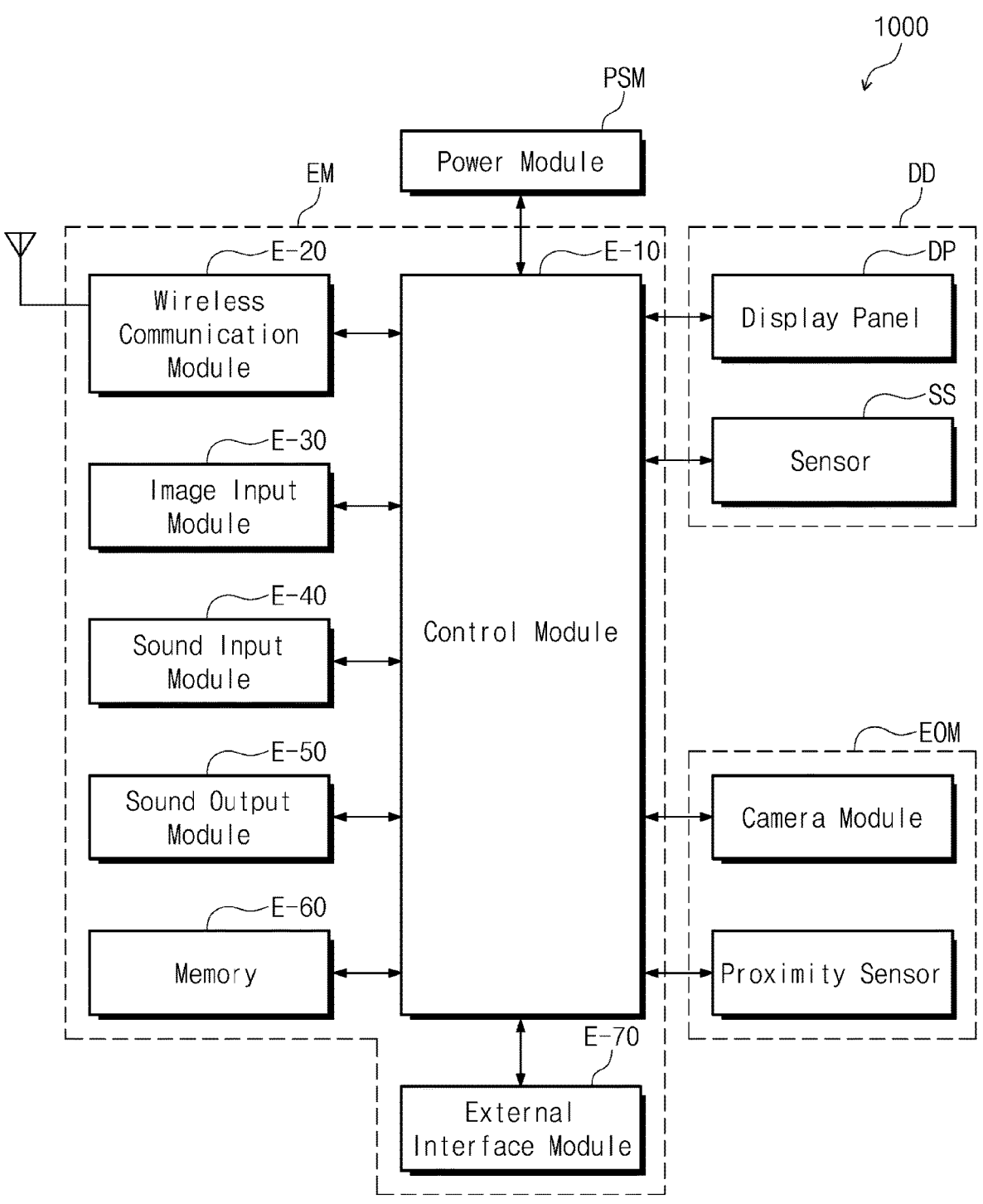
FIG. 2B is a block diagram representing the electronic device according to an embodiment of the inventive concept.

FIG. 2A is an exploded perspective view illustrating the electronic device 1000 according to an embodiment of the inventive concept. FIG. 2B is a block diagram of the electronic device 1000 according to an embodiment of the inventive concept.

As illustrated in FIGS. 2A and 2B, the electronic device 1000 may include a display device DD, an electronic module EM, an electronic optical module EOM, a power module PSM, and a housing HM. The electronic device 1000 may further include an additional component that is not shown.

The display device DD generates an image and senses at least an external input. The display device DD includes a window WM and a display module DM.

The window WM provides a front surface of the electronic device 1000. The window WM may include a glass film or a synthetic resin film as a base film. The window WM may further include an anti-reflection layer or an anti-fingerprint layer. The window WM may further include a bezel pattern overlapping a peripheral area DP-NA of a display panel DP. The window WM and the display module DM may be coupled through an adhesive layer.

The display module DM may include at least the display panel DP. Although only the display panel DP in a laminated structure of the display module DM is illustrated, the display module DM may further include a plurality of components disposed on the display panel DP. A detailed description on the laminated structure of the display module DM will be described later.

The display panel DP may include a display area DP-A and a peripheral area DP-NA. The display area DP-A may correspond to the display area 1000A illustrated in FIG. 1. A pixel is disposed on the display area DP-A. A light emitting element is disposed on the display area DP-A, but is not disposed on the peripheral area DP-NA.

The display panel DP may include a sensing area 100SA corresponding to the sensing area 1000SA of FIG. 1. The sensing area 100SA may have a resolution less than that of each of other areas of the display area DP-A. A detailed description on the sensing area 100SA will be described later.

As illustrated in FIG. 2A, a driving chip DIC may be disposed on the peripheral area DP-NA of the display panel DP. A flexible circuit board FCB may be coupled to the peripheral area DP-NA of the display panel DP. The flexible circuit board FCB may be connected to a main circuit board. The main circuit board may be one electronic component of the electronic module EM. A bending area BA of the peripheral area DP-NA may be bent so that the flexible circuit board FCB is disposed below the display area DP-A.

The driving chip DIC may include driving elements for driving the pixel, e.g., a data driving circuit. Although a structure in which the driving chip DIC is mounted onto the display panel DP is illustrated in FIG. 2A, the inventive concept is not limited thereto. For example, the driving chip DIC may be mounted onto the flexible circuit board FCB.

Referring to FIG. 2A, the electronic module EM and the power module PSM may be accommodated in the housing IM. The housing HM is coupled with the display device DD, particularly the window WM, to accommodate the above-described other modules.

As illustrated in FIG. 2B, the display device DD includes the display panel DP and a sensor SS. The sensor SS may include at least one of an input sensor, an antenna sensor, and a fingerprint sensor.

The electronic module EM may include a control module E-10, a wireless communication module E-20, an image input module E-30, a sound input module E-40, a sound output module E-50, a memory E-60, an external interface module E-70, etc. The electronic module EM may include a main circuit board, and the above-described modules may be mounted to the main circuit board or electrically connected to the main circuit board through a flexible circuit board. The electronic module EM may be electrically connected to the power module PSM.

The control module E-10 controls an overall operation of the electronic device 1000. For example, the control module E-10 activates or deactivates the display device DD according to a user's input. The control module E-10 may control the image input module E-30, the sound input module E-40, and the sound output module E-50 according to the user's input. The control module E-10 may include at least one microprocessor.

The wireless communication module E-20 transceives a wireless signal with another terminal by using a Bluetooth or WiFi link. The wireless communication module E-20 may use a general communication line to transceive a voice signal. The wireless communication module E-20 may include a plurality of antenna modules.

The image input module E-30 processes an image signal to convert the image signal into image data that is displayable in the display device DD. The sound input module E-receives an external sound signal through a microphone in a recording mode or a voice recognition mode to convert the received sound signal into electrical voice data. The sound output module E-50 converts sound data received from the wireless communication module E-20 or sound data stored in the memory E-60 and outputs the converted sound data to the outside.

The external interface module E-70 serves as an interface connected to an external charger, a wire/wireless data port, or a card socket (e.g., a memory card socket and a subscriber identification module (SIM)/user identity module (UIM) card socket).

The power module PSM supplies power that is used for the overall operation of the electronic device 1000. The power module PSM may include a typical battery device.

The electronic optical module EOM may be an electronic component that outputs or receives an optical signal. The electronic optical module EOM may include a camera module and/or a proximity sensor. The camera module may photograph an external image through the sensing area 1000SA.

Figure 3:
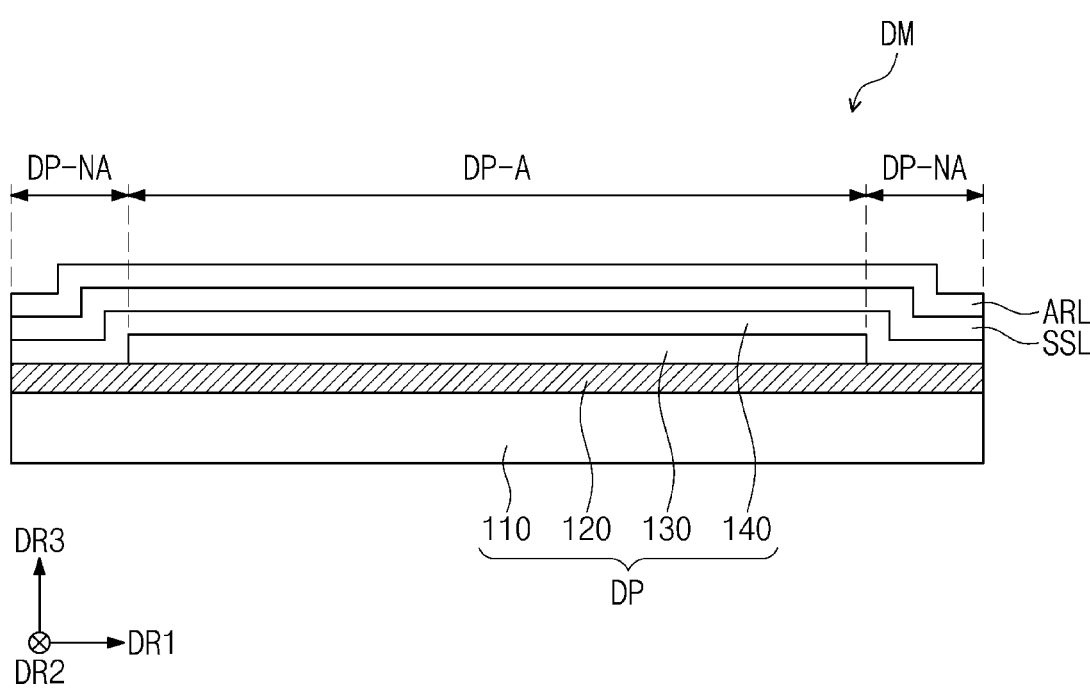
FIG. 3 is a cross-sectional view illustrating a display module according to an embodiment of the inventive concept.

FIG. 3 is a cross-sectional view illustrating the display module DM according to an embodiment of the inventive concept.

Referring to FIG. 3, the display device DD may include the display panel DP, a sensor layer SSL, and an anti-reflection layer ARL. The display layer DP may be a component that generates an image. The display panel DP may be a light emitting display panel. For example, the display panel DP may be an organic light emitting display panel, an inorganic light emitting display panel, a micro-light emitting diode (LED) display panel, or a nano-LED display panel. The display panel DP may be referred to as a display layer.

The display panel DP may include a base layer 110, a circuit layer 120, a light emitting element layer 130, and an encapsulation layer 140.

The base layer 110 may be a member providing a base surface on which the circuit layer 120 is disposed. The base layer 110 may be a rigid substrate or a flexible substrate that is bendable, foldable, or rollable. The base layer 110 may include a glass substrate, a metal substrate, or a polymer substrate. However, the inventive concept is not limited thereto. For example, the base layer 110 may be an inorganic layer, an organic layer, or a composite material layer.

The base layer 110 may have a multilayer structure. For example, the base layer 110 may include a first synthetic resin layer, a single layered or multiple layered inorganic layer, and a second synthetic resin layer disposed on the single layered or multiple layered inorganic layer. Each of the first and second synthetic resin layers may include a polyimide-based resin. However, the inventive concept is not limited thereto.

The base layer 110 may include a display area DP-A and a peripheral area DP-NA.

The circuit layer 120 may be disposed on the base layer 110. The circuit layer 120 may include an insulation layer, a semiconductor pattern, a conductive pattern, and a signal line.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 against moisture, oxygen, and foreign substances such as dust particles. The encapsulation layer 140 may include at least one inorganic layer. The encapsulation layer 140 may include a laminated structure of an inorganic layer/an organic layer/an inorganic layer. The encapsulation layer 140 may cover side surfaces of the light emitting element layer 130.

The sensor layer SSL may be disposed on the display panel DP. The sensor layer SSL may include at least one of an input sensor, an antenna sensor, and a fingerprint sensor. The sensor layer SSL may be provided on the display panel DP through a continuous process. In this case, the sensor layer SSL may be directly disposed on the display panel DP. The feature of being directly disposed may represent that a third component is not disposed between the sensor layer SSL and the display panel DP. In other words, an adhesive layer may not be disposed between the sensor layer SSL and the display panel DP.

The anti-reflection layer ARL may be directly disposed on the sensor layer SSL. The anti-reflection layer ARL may reduce a reflectance of external light incident from the outside of the display device DD. The anti-reflection layer ARL may be provided on the sensor layer SSL through a continuous process. The anti-reflection layer ARL may include color filters. The color filters may have a predetermined arrangement. For example, the color filters may be arranged in consideration of colors of light emitted from pixels contained in the display panel DP. In addition, the anti-reflection layer ARL may further include a black matrix adjacent to the color filters. A detailed description on the anti-reflection layer ARL will be provided later.

In an embodiment of the inventive concept, the sensor layer SSL may be omitted. In this case, the anti-reflection layer ARL may be directly disposed on the display panel DP. In an embodiment of the inventive concept, the sensor layer SSL and the anti-reflection layer ARL may be changed in position. For example, in one case the anti-reflection layer ARL may form an upper surface of the display module DM, and in another case the sensor layer SSL may form the upper surface of the display module DM.

Figure 4A:
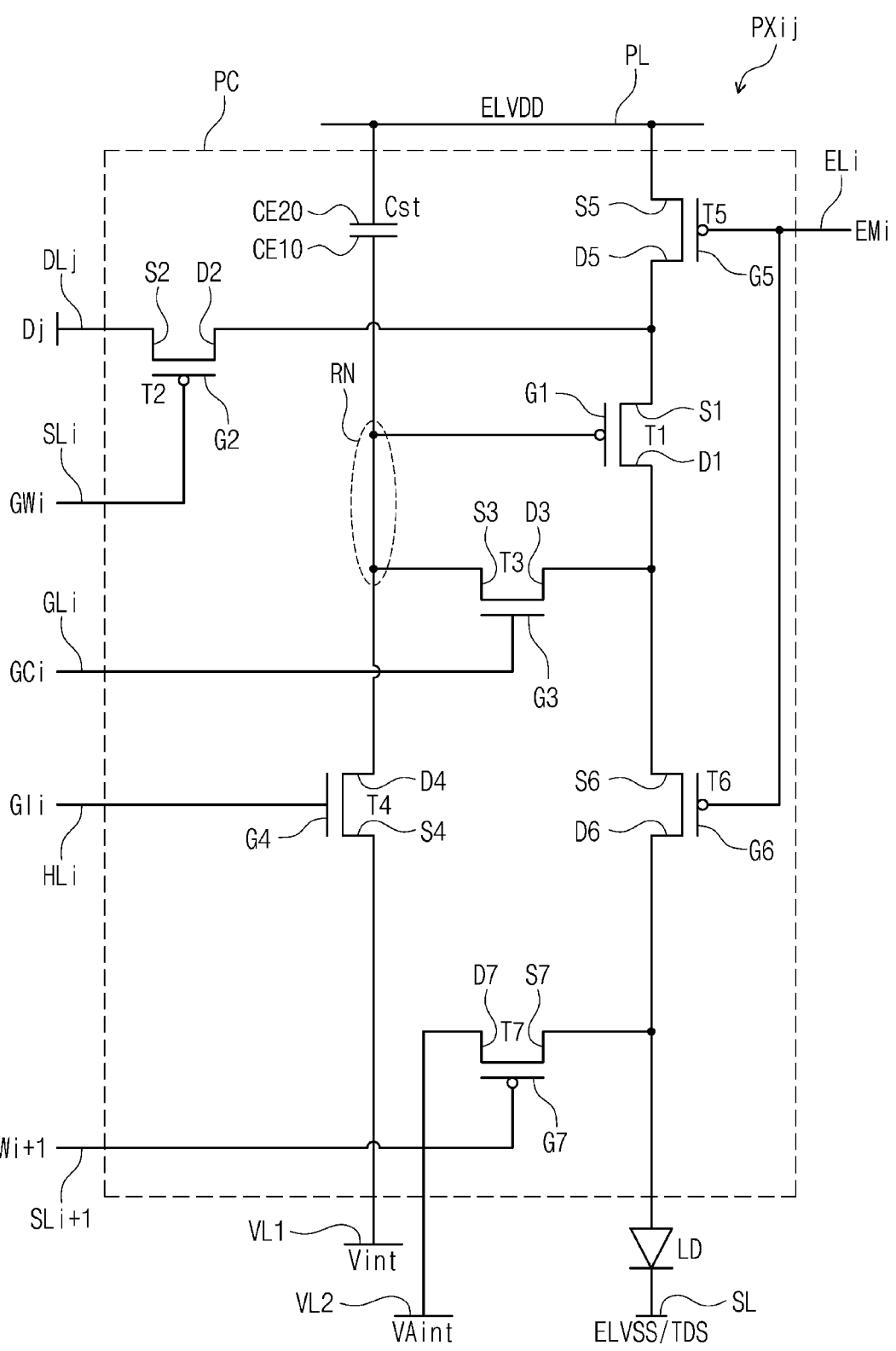
FIG. 4A is an equivalent circuit diagram of a pixel according to an embodiment of the inventive concept.
Figure 4B:
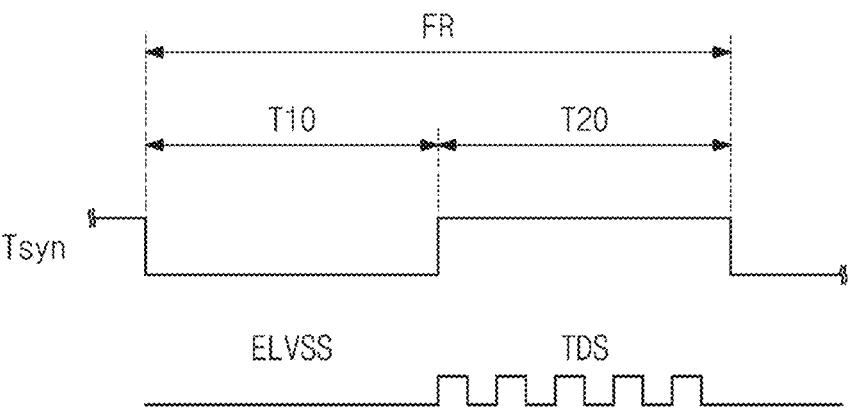
FIG. 4B is a timing diagram representing a method for driving the display device according to an embodiment of the inventive concept.
Figure 4C:
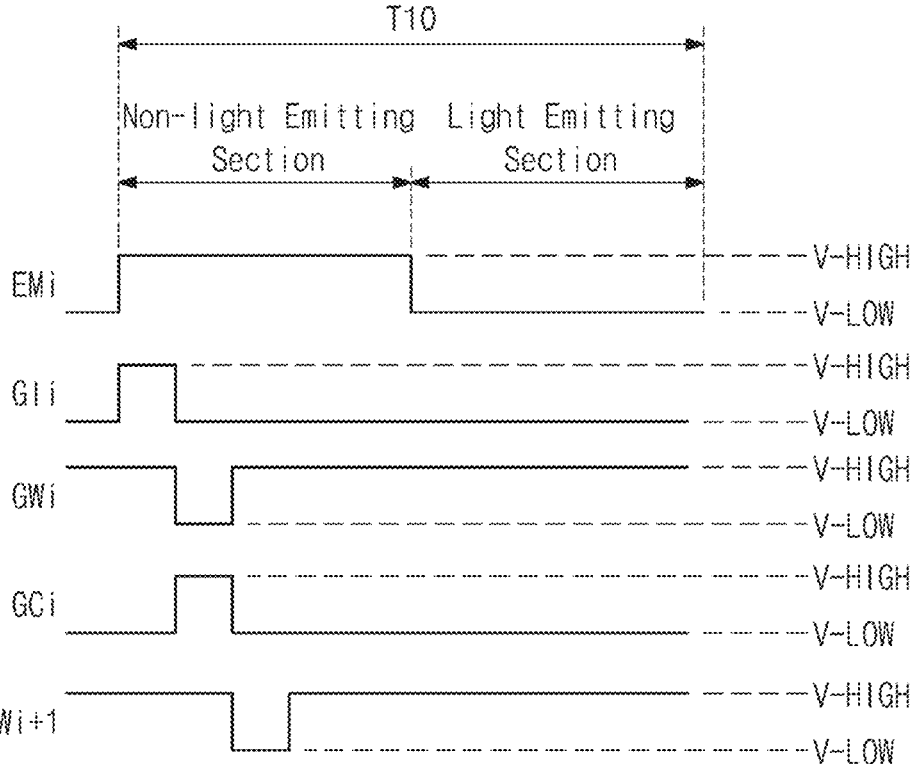
FIG. 4C is a timing diagram representing a method for driving the pixel according to an embodiment of the inventive concept.

FIG. 4A is an equivalent circuit diagram of a pixel PXij according to an embodiment of the inventive concept. FIG. 4B is a timing diagram illustrating a method for driving the display device according to an embodiment of the inventive concept. FIG. 4C is a timing diagram illustrating a method for driving the pixel according to an embodiment of the inventive concept.

FIG. 4A illustrates the pixel PXij connected to an i-th scan line SLi and a j-th data line DLj of a first group as an example. The pixel PXij may include a pixel driving circuit PC (hereinafter, referred to a pixel circuit) and a light emitting element LD.

In the present embodiment, the pixel circuit PC may include first, second, third, fourth, fifth, sixth and seventh transistors T1, T2, T3, T4, T5, T6 and T7 and a capacitor Cst. In the present embodiment, each of a first transistor T1, a second transistor T2, and fifth to seventh transistors T5 to T7 is a p-type transistor, and each of a third transistor T3 and a fourth transistor T4 is a n-type transistor. However, the inventive concept is not limited thereto. For example, each of the first to seventh transistors T1 to T7 may be one of the p-type transistor and the n-type transistor. It will be understood that an input region (or an input electrode) of the n-type transistor is a drain (or a drain region), an input region (or an input electrode) of the p-type transistor is a source (or a source region), an output region (or an output electrode) of the n-type transistor is a source (or a source region), and an output region (or an output electrode) of the p-type transistor is a drain (or a drain region). In addition, in an embodiment of the inventive concept, at least one of the first to seventh transistors T1 to T7 may be omitted.

In this embodiment, the first transistor T1 may be a driving transistor, and the second transistor T2 may be a switching transistor. The capacitor Cst is electrically connected between a first voltage line PL receiving a first power voltage ELVDD and a reference node RN. The capacitor Cst includes a first electrode CE10 electrically connected to the reference node RN and a second electrode CE20 electrically connected to the first voltage line PL. The first electrode CE10 of the capacitor Cst may be electrically connected to the first transistor T1.

The light emitting element LD is electrically connected between the first transistor T1 and a signal line SL. The signal line SL may provide a second power voltage ELVSS or a driving signal TDS to a cathode of the light emitting element LD. In other words, the signal line SL may provide the second power voltage ELVSS or the driving signal TDS to a second terminal of the light emitting element LD. The second power voltage ELVSS may have a level less than that of the first power voltage ELVDD.

The first transistor T1 may be electrically connected between the first voltage line PL and an anode of the light emitting element LD. In other words, the first transistor T1 may be electrically connected between the first voltage line PL and a first terminal of the light emitting element LD. A source S1 of the first transistor T1 is electrically connected to the first voltage line PL. In this specification, the expression "being electrically connected between a transistor and a signal line or between transistors" may indicate that "a source, a drain, and a gate of the transistor are integrated with the signal line or connected to the signal line through a connection electrode". Another transistor may be disposed or may not be disposed between the first voltage line PL and the source S1 of the first transistor T1.

A drain D1 of the first transistor T1 is electrically connected to the anode of the light emitting element LD. Another transistor may be disposed or may not be disposed between the drain D1 and the anode of the light emitting element LD. A gate G1 of the first transistor T1 is electrically connected to the reference node RN. For example, the gate G1 of the first transistor T1 is electrically connected to the first electrode CE10 of the capacitor Cst.

The second transistor T2 is electrically connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In this embodiment, a gate G2 of the second transistor T2 may be electrically connected to the i-th scan line SLi of the first group.

The third transistor T3 is electrically connected between the reference node RN and the drain D1 of the first transistor T1. A drain D3 of the third transistor T3 is electrically connected to the drain D1 of the first transistor T1, and a source S3 of the third transistor T3 is electrically connected to the reference node RN. For example, the source S3 of the third transistor T3 is electrically connected to the gate G1 of the first transistor T1. Although the third transistor T3 including a single gate is illustrated, the third transistor T3 may include a plurality of gates. In this embodiment, a gate G3 of the third transistor T3 may be electrically connected to an i-th scan line GLi of the second group. The fourth transistor T4 is electrically connected between the reference node RN and a second voltage line VL1. A drain D4 of the fourth transistor T4 is electrically connected to the reference node RN, and a source S4 of the fourth transistor T4 is electrically connected to the second voltage line VL1. Although the fourth transistor T4 including a single gate is illustrated, the fourth transistor T4 may include a plurality of gates. In this embodiment, a gate G4 of the fourth transistor T4 may be electrically connected to a i-th scan line HLi of a third group.

The fifth transistor T5 is electrically connected between the first voltage line PL and the source S1 of the first transistor T1. A source SS of the fifth transistor T5 is electrically connected to the first voltage line PL, and a drain D5 of the fifth transistor T5 is electrically connected to the source S1 of the first transistor T1. A gate G5 of the fifth transistor T5 may be electrically connected to an i-th light emitting line ELi.

The sixth transistor T6 is electrically connected between the drain D1 of the first transistor T1 and the light emitting element LID. A source S6 of the sixth transistor T6 is electrically connected to the drain D1 of the first transistor T1, and a drain D6 of the sixth transistor T6 is electrically connected to the anode of the light emitting element LD. A gate G6 of the sixth transistor T6 may be electrically connected to the i-th light emitting line ELi. In an embodiment of the inventive concept, the gate G6 of the sixth transistor T6 and the gate G5 of the fifth transistor T5 may be connected to different signal lines. For example, the first and sixth transistors T5 and T6 may be connected to different light emitting lines.

The seventh transistor T7 is electrically connected between the drain D6 of the sixth transistor T6 and a third voltage line VL2. A source S7 of the seventh transistor T7 is electrically connected to the drain D6 of the sixth transistor T6, and a drain D7 of the seventh transistor T7 is electrically connected to the third voltage line VL2. A gate G7 of the seventh transistor T7 may be electrically connected to a i+1-th scan line SLi+1 of the first group.

An operation of the display panel DD (refer to FIG. 2A) and the pixel PXij will be described in more detail with reference to FIGS. 4B and 4C.

As illustrated in FIG. 4B, the display device DD may operate by being synchronized with a synchronization signal Tsyn. The synchronization signal Tsyn may include a high period and a low period, and the high period and the low period may be alternately defined. The display device DD may display an image during a first period T10 in which the synchronization signal Tsyn is in a low state and sense an external input during a second period T20 in which the synchronization signal Tsyn is in a high state. One frame period FR may include one first period T10 and one second period T20. However, the inventive concept is not limited to sequence of the first period T10 and the second period T20. In other words, although the first period T10 and the second period T20 have the same length in FIG. 4B, the inventive concept is not limited thereto. For example, the second period T20 may be shorter than the first period T10. In addition, the second period T20 may correspond to a vertical blank period. The vertical blank period may be a period in which a vertical synchronization signal is inputted or a short period in which an image is not displayed during two consecutive frame periods.

During the first period T10, scan lines of the first group, scan lines of the second group, scan lines of the third group, and signal lines of each of the light emitting lines are sequentially scanned. FIG. 4C illustrates a portion of the first period T10.

Referring to FIG. 4C, each of signals Emi, Gli, GWi, GCi, and GWi+1 may have a high level V-HIGH during a partial period and a low level V-LOW during a partial period. N-type transistors may be turned-on when a corresponding signal has the high level V-HIGH, and p-type transistors may be turned-on when a corresponding signal has the low level V-LOW.

When a light emitting control signal EMi has the high level V-HIGH, the fifth transistor T5 and the sixth transistor T6 are turned-off. When the fifth transistor T5 and the sixth transistor T6 are turned-off, a current path is not provided between the first voltage line PL and the light emitting element LD. Thus, the corresponding period may be a non-light emitting period, or a non-light emitting section as shown in FIG. 4C.

When a scan signal Gli applied to the i-th scan line H Li of the third group has the high level V-HIGH, the fourth transistor T4 is turned-on. When the fourth transistor T4 is turned-on, the reference node RN is initialized by a first initialization voltage Vint.

When a scan signal GWi applied to the i-th scan line SLi of the first group has the low level V-LOW, and a scan signal GCi applied to the i-th scan line GLi of the second group has the high level V-HIGH, the second transistor T2 and the third transistor T3 are turned-on. In other words, when the scan signal GWi has the low level V-LOW and the scan signal GCi has the high level V-HIGH at the same time, the second transistor T2 and the third transistor T3 are turned-on.

Since the reference node RN is initialized by the first initialization voltage Vint, the first transistor T1 is turned-on. When the first transistor T1 is turned-on, a voltage corresponding to a data signal Dj is provided to the reference node RN. Here, the capacitor Cst stores the voltage corresponding to the data signal Dj. The voltage corresponding to the data signal Dj may be a voltage reduced as much as a threshold voltage Vth of the first transistor T1 from the data signal Dj.

When a scan signal GWi+1 applied to the i+I-th scan line SLi of the first group has the low level V-LOW, the seventh transistor T7 is turned-on. As the seventh transistor T7 is turned-on, the anode of the light emitting element LD is initialized by a second initialization voltage VAint. As shown in FIG. 4C, the seventh transistor T7 is turned on after the second and third transistors T2 and T3 are turned off. A parasitic capacitor of the light emitting element LD may be discharged.

When the light emitting control signal EMi has the low level V-LOW, the fifth transistor T5 and the sixth transistor T6 are turned-on. When the fifth transistor T5 is turned-on, a first power voltage ELVDD is provided to the first transistor T1. When the sixth transistor T6 is turned-on, the first transistor T1 and the light emitting element LD are electrically connected. The light emitting element LD generates light having luminance corresponding to a received current amount. In other words, a light emitting section of the first period T10 may be entered.

Referring to FIG. 4B, the second power voltage ELVSS applied to the cathode of the light emitting element LD during the first period T10 maintains a constant level. The driving signal TDS applied to the cathode of the light emitting element LD during the second period T20 may be an alternating current signal. The driving signal TDS may include a plurality of pulse signals.

Figure 5A:
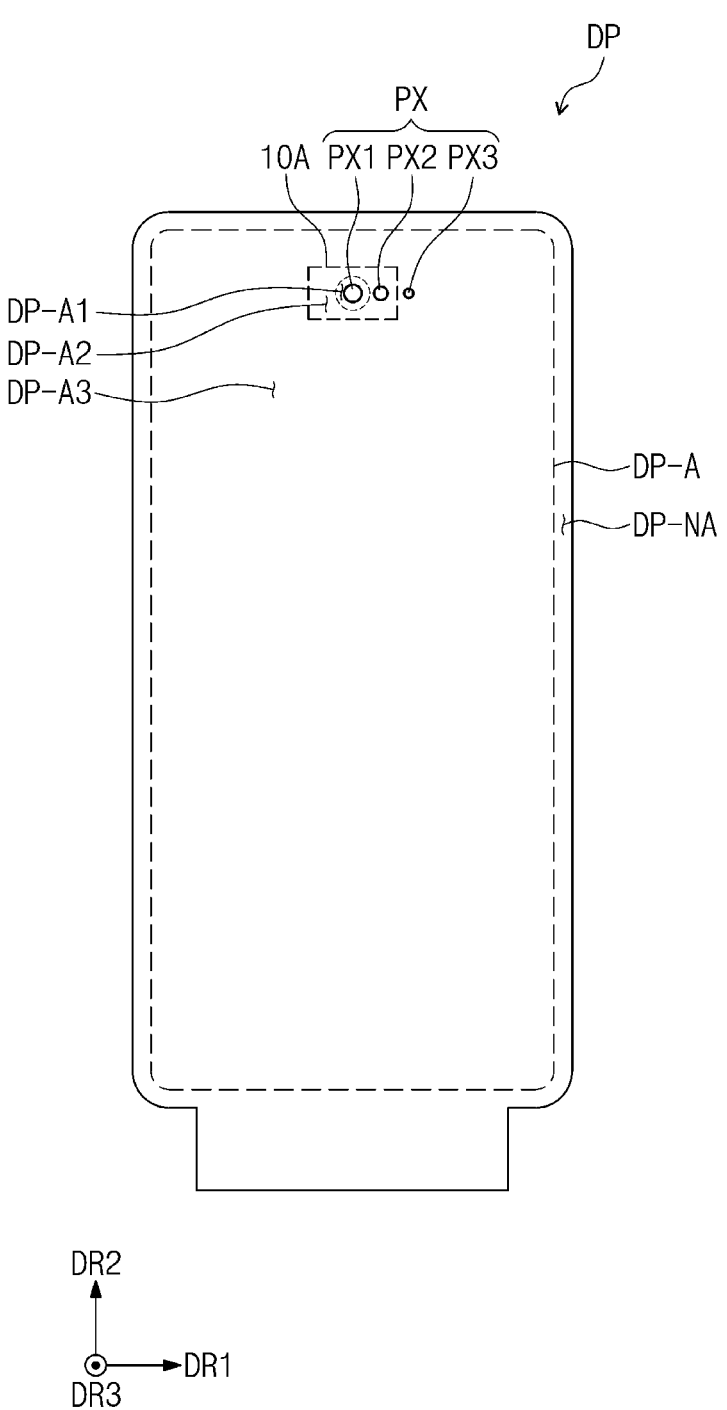
FIG. 5A is a plan view illustrating a display panel according to an embodiment of the inventive concept.
Figure 5B:
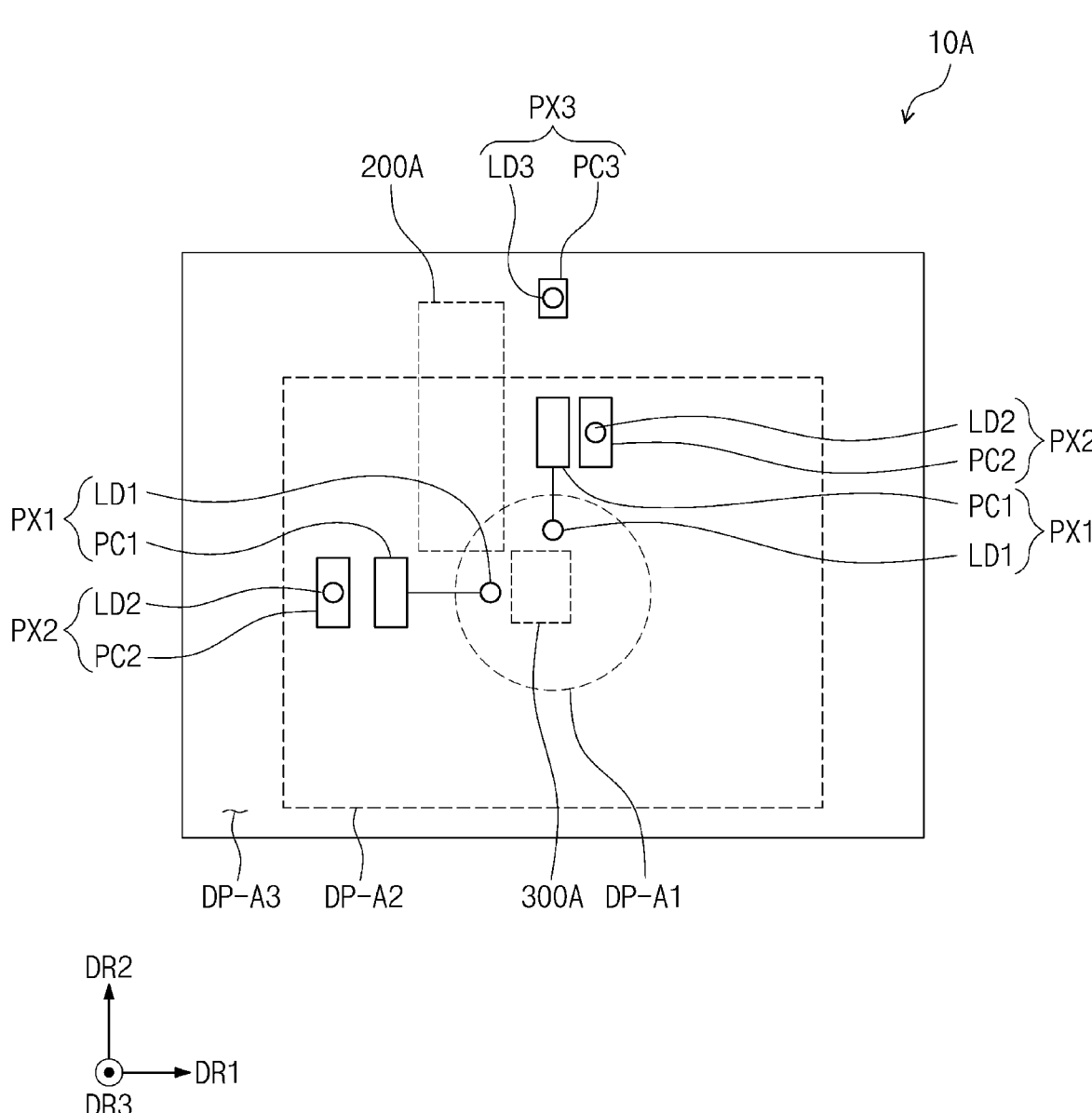
FIG. 5B is an enlarged plan view illustrating a portion of FIG. 5A.
Figure 5C:
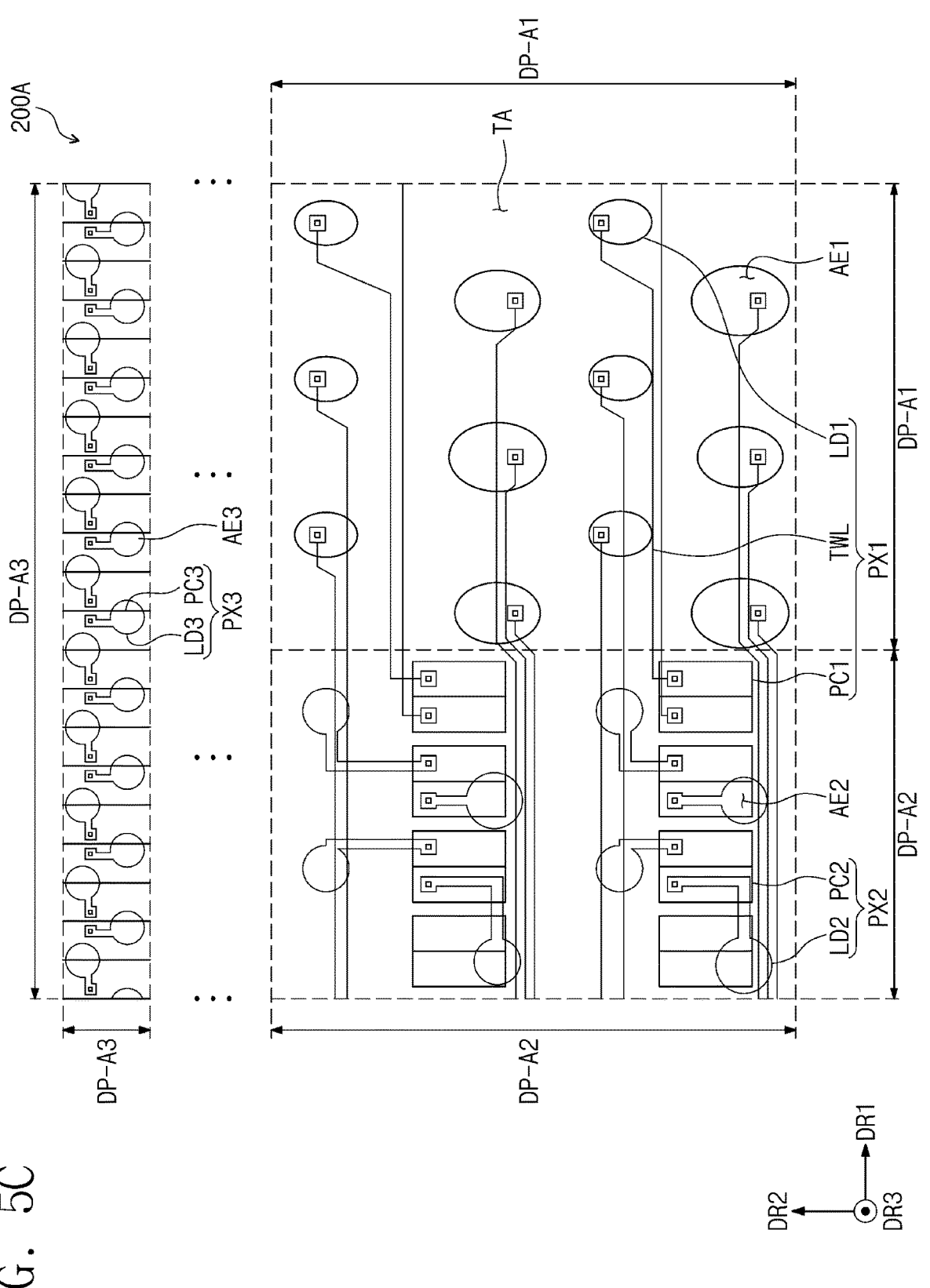
FIG. 5C is an enlarged plan view illustrating a portion of FIG. 5B.
Figure 5D:
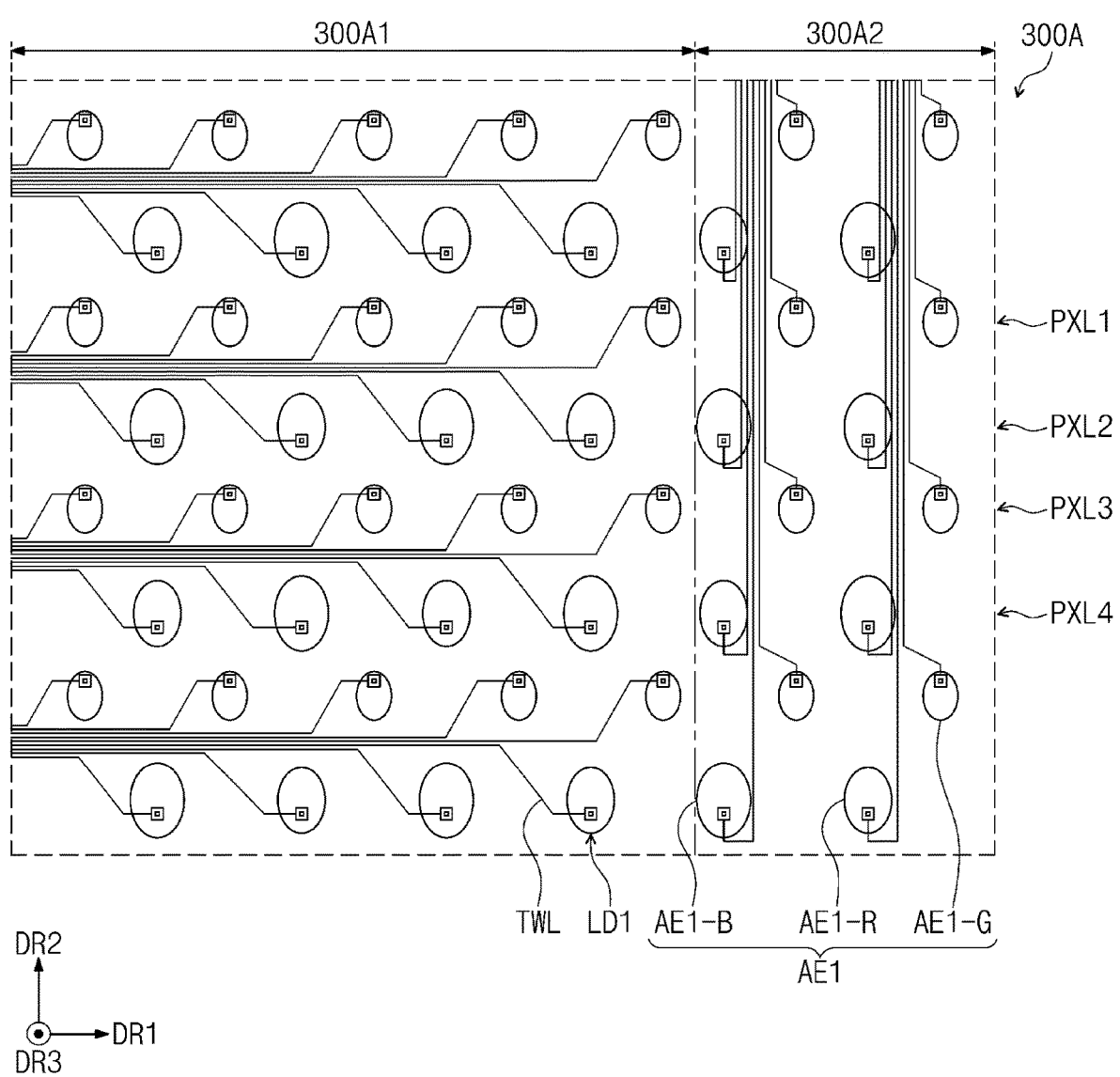
FIG. 5D is an enlarged plan view illustrating a portion of FIG. 5B.
Figure 5E:
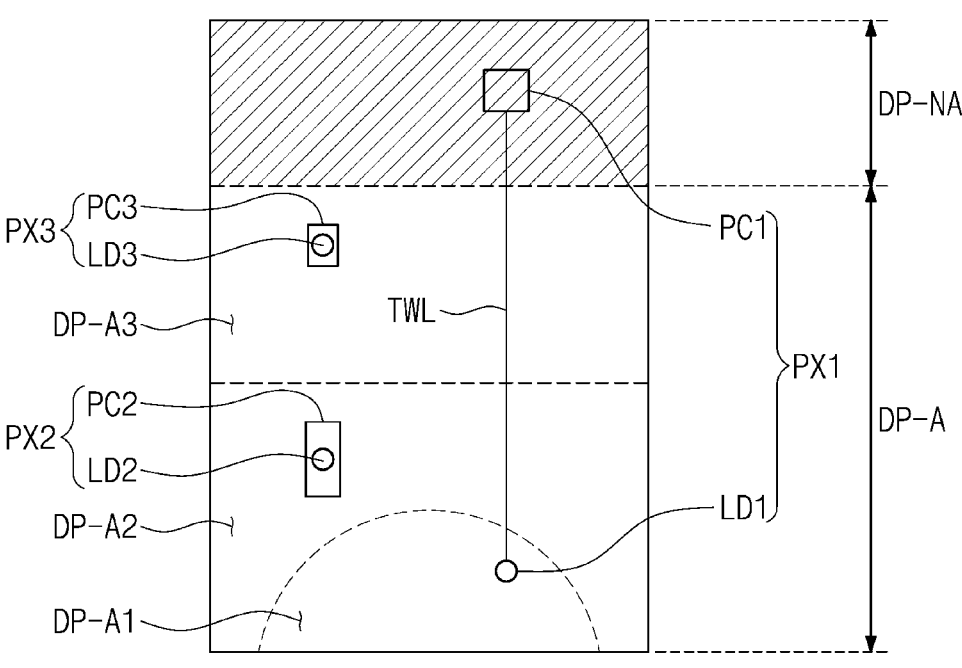
FIG. 5E is a plan view illustrating the display panel according to an embodiment of the inventive concept.
Figure 5E:
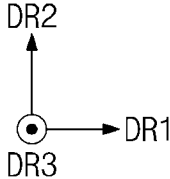

FIG. 5A is a plan view illustrating a display panel DP according to an embodiment of the inventive concept. FIG. 5B is an enlarged plan view illustrating area 10A of FIG. 5A. FIG. 5C is an enlarged plan view illustrating area 200A of FIG. 5B. FIG. 5D is an enlarged plan view illustrating area 300A of FIG. 5B. FIG. 5E is a plan view illustrating the display panel according to an embodiment of the inventive concept.

Referring to FIG. 5A, the display panel DP may include a display area DP-A and a peripheral area DP-NA. The peripheral area DP-NA may be adjacent to the display area DP-A and surround at least a portion of the display area DP-A.

The display area DP-A may include a first area DP-A1, a second area DP-A2, and a third area DP-A3. The first area DP-A1 may correspond to the sensing area 1000SA in FIG. 1 or the sensing area 100SA in FIG. 2A. Although the first area DP-A1 having a circular shape is illustrated in this embodiment, the inventive concept is not limited thereto. For example, the first area DP-A1 may have various shapes such as a polygon, an ellipse, a figure having at least one curved side, or an amorphous shape.

The display panel DP may include a plurality of pixels PX. The display panel DP may include a first group pixel PX1 including a light emitting element disposed on the first area DP-A1, a second group pixel PX2 including a light emitting element disposed on the second area DP-A2, and a third group pixel PX3 including a light emitting element disposed on the third area DP-A3. Each of the first group pixel PX1, the second group pixel PX2, and the third group pixel PX3 may include the pixel circuit PC in FIG. 4A. A position of each of the first group pixel PX1, the second group pixel PX2, and the third group pixel PX3 in FIG. 5A is illustrated based on a position of the corresponding light emitting element LD (refer to FIG. 4A).

Each of the first group pixel PX1, the second group pixel PX2, and the third group pixel PX3 may include a plurality of pixels. In this case, each of the first to third group pixels PX1, PX2, and PX3 may include a red pixel, a green pixel, and a blue pixel, and may further include a white pixel according to an embodiment of the inventive concept.

The first area DP-A1, the second area DP-A2, and the third area DP-A3 may be distinguished by a transmittance or a resolution thereof. The transmittance or a resolution is measured in a reference surface area.

The first area DP-A1 has a transmittance greater than that of each of the second area DP-A2 and the third area DP-A3. This is because a ratio of an area occupied by a light shielding structure in the first area DP-A1 is less than that in each of the second area DP-A2 and the third area DP-A3. An area that is not occupied by the light shielding structure corresponds to a transmission area of an optical signal. The light shielding structure may include a conductive pattern, a pixel defining layer, and a pixel defining pattern of a circuit layer, which will be described later.

The third area DP-A3 has a resolution greater than that of each of the first area DP-A1 and the second area DP-A2. The number of light emitting elements disposed in the third area DP-A3 is greater than that in each of the first area DP-A1 and the second area DP-A2 based on the reference surface area (or the same surface area).

When distinguished based on the transmittance, the first area DP-A1 may be a first transmittance area, and the second area DP-A2 and the third area DP-A3 may be different portions in a second transmittance area that is distinguished from the first transmittance area. The second area DP-A2 and the third area DP-A3 may have the substantially same transmittance as each other. Although the transmittances of the second area DP-A2 and the third area DP-A3 are not same as each other, since the transmittance of the first area DP-A1 is much larger than that of each of the second area DP-A2 and the third area DP-A3, the second area DP-A2 and the third area DP-A3 may be referred to as the second transmittance area when the first area DP-A1 is referred to as the first transmittance area.

When distinguished based on the resolution, the first area DP-A1 and the second area DP-A2 may be different portions in a first resolution area, and the third area DP-A3 may be a second resolution area that is distinguished from the first resolution area. The number of light emitting elements for each reference surface area of the first area DP-A1 may be substantially same as that of light emitting elements for each reference surface area of the second area DP-A2.

Referring to FIG. 5B, the first group pixel PX1 may include a first light emitting element LD1 and a first pixel circuit PC1 electrically connected to the first light emitting element LD1. The second group pixel PX2 may include a second light emitting element LD2 and a second pixel circuit PC2 for driving the second light emitting element LD2, and the third group pixel PX3 may include a third light emitting element LD3 and a third pixel circuit PC3 for driving the third light emitting element LD3.

The first light emitting element LD1 is disposed on the first area DP-A1, and the first pixel circuit PC1 is disposed on the second area DP-A2. The second light emitting element LD2 and the second pixel circuit PC2 are disposed on the second area DP-A2. The third light emitting element LD3 and the third pixel circuit PC3 are disposed on the third area DP-A3.

The first pixel circuit PC1 is moved from the first area DP-A1 to the second area DP-A2 to increase a transmittance of the first area DP-A1. An occupation rate of the transmission area may increase by removing a light shielding structure such as a transistor, and as a result, the transmittance of the first area DP-A1 may increase.

Two kinds of first group pixels PX1 are illustrated as an example in FIG. 5B. One first group pixel PX1 includes the first light emitting element LD1 spaced apart from the first pixel circuit PC1 in a first direction DR1. The other first group pixel PX1 includes the first light emitting element LD1 spaced apart from the first pixel circuit PC1 in a second direction DR2. Although not shown, the first group pixel PX1 disposed at a right side of the first area DP-A1 may have an arrangement relationship between the first light emitting element LD1 and the first pixel circuit PC1, which is similar to that of the first group pixel PX1 disposed at a left side of the first area DP-A1. Thus, in the first group pixel PX1 disposed at the right side of the first area DP-A1, the first light emitting element LD1 may spaced apart from the first pixel circuit PC1 in the first direction DR1. In addition, the first group pixel PX1 disposed at a lower side of the first area DP-A1 may have an arrangement relationship between the first light emitting element LD1 and the first pixel circuit PC1, which is similar to that of the first group pixel PX1 disposed at an upper side of the first area DP-A1. Thus, in the first group pixel PX1 disposed at the lower side of the first area DP-A1, the first light emitting element LD1 may be spaced apart from the first pixel circuit PC1 in the second direction DR2.

In FIG. 5C, anodes (or first electrodes AE1, AE2, and AE3) of the light emitting element are illustrated to respectively represent the first light emitting element LD1, the second light emitting element LD2, and the third light emitting element LD3. The number of first light emitting elements LD1 is less than that of third light emitting elements LD3 based on the reference surface area to increase the transmittance of the first area DP-A1. For example, the first area DP-A1 has a resolution that is about ½, ⅜, ⅓, ¼, ²⁄₉, ⅛, ⅑, and ¹⁄₁₆ of a resolution of the third area DP-A3. For example, the third area DP-A3 may have a resolution of about 400 ppi, and the first area DP-A1 may have a resolution of about 200 ppi or about 100 ppi. However, this is merely one example, and the inventive concept is not limited thereto. Here, the anode AE1 of the first light emitting elements LD1 may have an area greater than that of the anode AE3 of the third light emitting elements LD3 to increase luminance of the first area DP-A1.

An area on which the first light emitting elements LD1 is not disposed in the first area DP-A1 may be a transmission area TA.

The number of second light emitting elements LD2 is less than that of the third light emitting elements LD3 based on the reference surface area in order to secure an area on which the first pixel circuit PC1 is disposed in the second area DP-A2. The first pixel circuit PC1 is disposed on an area on which the second pixel circuit PC2 is not disposed in the second area DP-A2.

The first light emitting elements LD1 may be electrically connected to the first pixel circuit PC1 through a pixel connection line TWL. The pixel connection line TWL overlaps the first area DP-A1 and the second area DP-A2. The pixel connection line TWL may overlap the transmission area TA.

Each of the anodes AE1, AE2, and AE3 may have a curved edge. The anodes AE1, AE2, and AE3 each having the curved edge may minimize diffraction of light. Particularly, the anode AE1 of the first light emitting element LD1 may minimize diffraction of light passing through the transmission area.

Referring to FIG. 5D, the first light emitting elements LD1 having three colors are illustrated. One anode AE1-R, another anode AE1-G, and another anode AE1-B are illustrated to respectively represent the first light emitting element LD1 having a first color, the first light emitting element LD1 having a second color, and the first light emitting element LD1 having a third color. The first color may be red, the second color may be green, and the third color may be blue. However, the inventive concept is not limited thereto. For example, the first to third colors may adopt others of the three primary colors.

First, second, third and fourth light emitting element rows PXL1, PXL2, PXL3 and PXL4 disposed in the first area DP-A1 are illustrated. The anodes AE1-G having the second color may be arranged in each of the first and third light emitting element rows PXL1 and PXL3 in the first direction DR1. The first anodes AE1-R and the third anodes AE1-B may be alternately arranged in each of the second and fourth light emitting element rows PXL2 and PXL4 in the first direction DR1. The first anode AE1-R of the second light emitting element row PXL2 is aligned with the third anode AE1-B of the fourth light emitting element row PXL4 in the second direction DR2. The above-described arrangement of the first to fourth light emitting element rows PXL1 to PXL4 may be expanded to the second area DP-A2 and the third area DP-A3.

The second area DP-A2 or the third area DP-A3 illustrated in FIGS. 5A to 5C may also have the same pixel arrangement as the first to fourth light emitting element rows PXL1 to PXL4. Since the third area DP-A3 has the resolution greater than that of the first area DP-A1, a distance between the anodes AE1-R, AE1-G, and AE1-B may be narrow.

The anodes AE1-R, AE1-G, and AE1-B disposed on a partial area 300A1 correspond to anodes of the first group pixel PX1 disposed at the left side of the first area DP-A1 in FIG. 5B, and the anodes AE1-R, AE1-G, and AE1-B disposed on another partial area 300A2 correspond to anodes of the first group pixel PX1 disposed at the upper side of the first area DP-A1 in FIG. 5B. An extension direction of the pixel connection line TWL may be changed according to positions of the anodes AE1-R, AE1-G, and AE1-B.

Referring to FIG. 5E, the first pixel circuit PC1 may be disposed on a fourth area instead of the first area DP-A1, the second area DP-A2, and the third area DP-A3. As illustrated in FIG. 5E, the first pixel circuit PC1 may be disposed on the peripheral area DP-NA. The pixel connection line TWL may overlap the first area DP-A1, the second area DP-A2, the third area DP-A3, and the peripheral area DP-NA.

Figure 6:
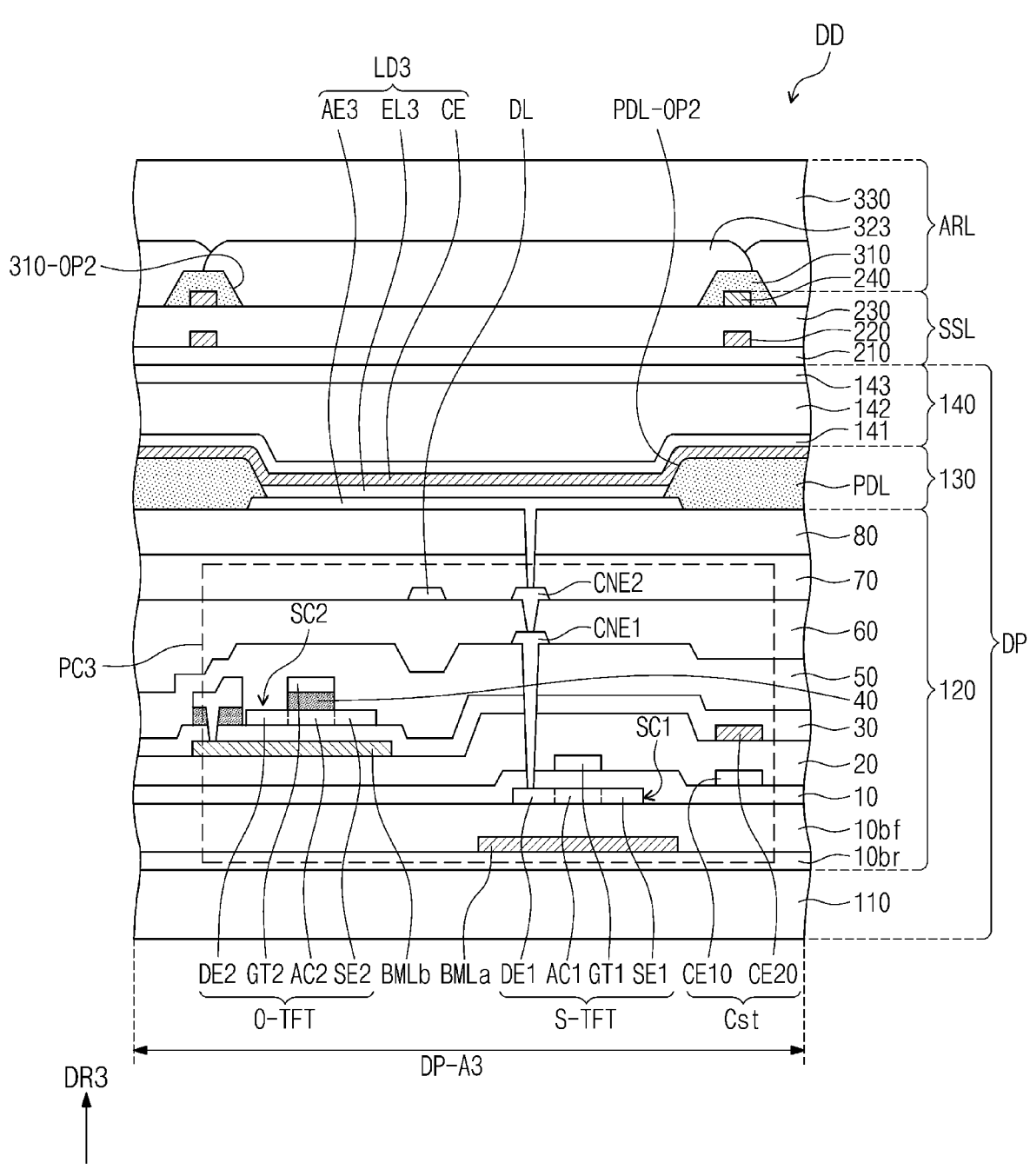
FIG. 6 is a cross-sectional view illustrating a third area of the display device according to an embodiment of the inventive concept.
Figure 7:
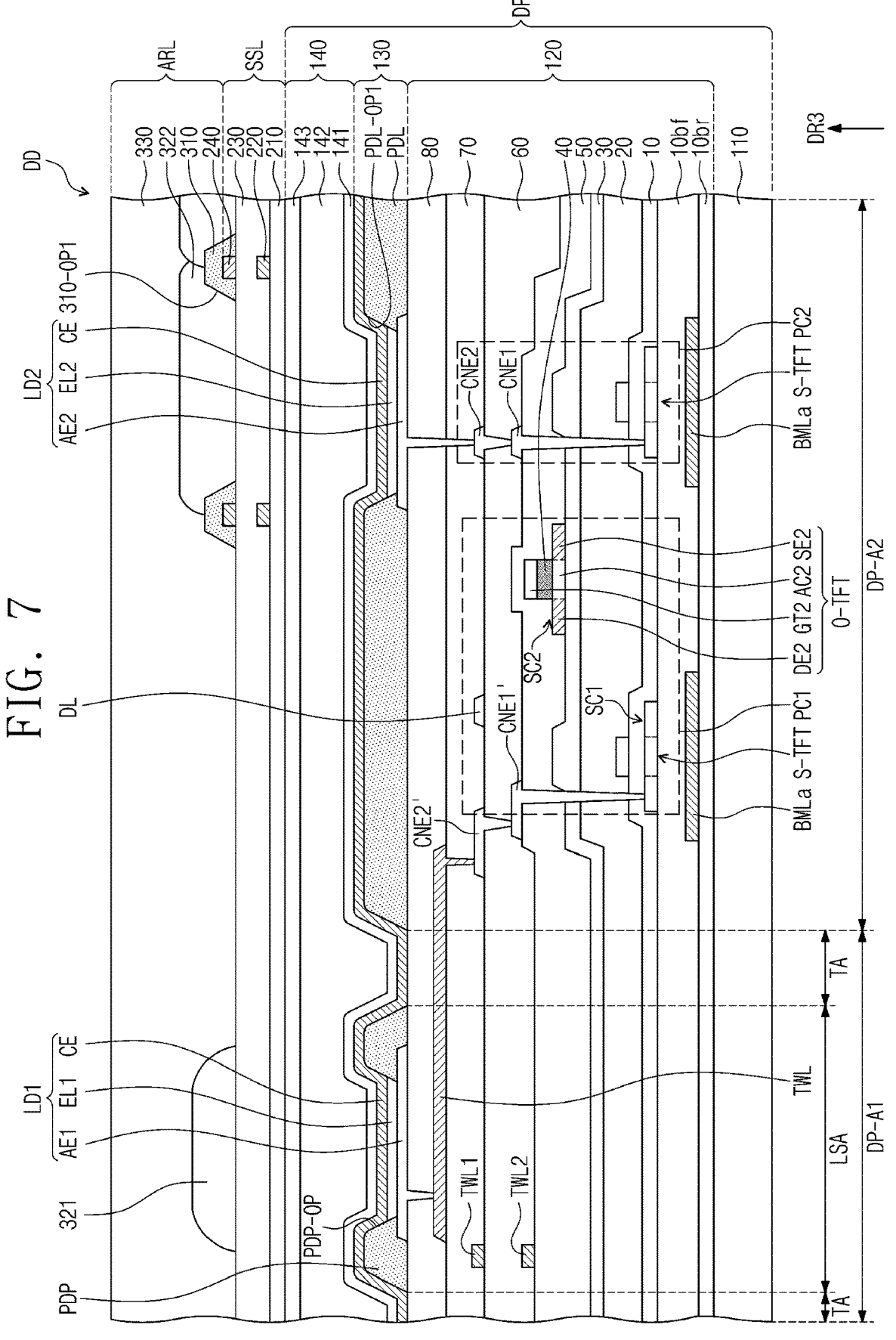
FIG. 7 is a cross-sectional view illustrating a first area and a second area of the display device according to an embodiment of the inventive concept.

FIG. 6 is a cross-sectional view corresponding to the third area DP-A3 of the display device DD according to an embodiment of the inventive concept. FIG. 7 is a cross-sectional view corresponding to the first area DP-A1 and the second area DP-A2 of the display device DD according to an embodiment of the inventive concept.

In FIG. 6, the third light emitting element LD3 and a silicon transistor S-TFT and an oxide transistor O-TFT of the third pixel circuit PC3 (refer to FIG. 5C) are illustrated. In the equivalent circuit illustrated in FIG. 4A, the third and fourth transistors T3 and T4 may be the oxide transistor O-TFT, and the rest transistors, e.g., T1, T2 and T5-T7, may be the silicon transistor S-TFT. In FIG. 7, a portion of the first pixel circuit PC1 and the first light emitting element LD1 are illustrated, and a portion of the second pixel circuit PC2 and the second light emitting element LD2 are illustrated. The silicon transistor S-TFT illustrated in FIG. 7 may be the sixth transistor T6 illustrated in FIG. 4A.

A barrier layer 10*br* may be disposed on the base layer 110. The barrier layer 10*br* may prevent foreign substances from being introduced from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately laminated with each other.

A first shielding electrode BMLa may be disposed on the barrier layer 10*br*. The first shielding electrode BMLa may include metal. The first shielding electrode BMLa may include molybdenum (Mo) having excellent heat resistance, an alloy containing molybdenum, titanium (Ti), or an alloy containing titanium. The first shielding electrode BMLa may receive a bias voltage. The first shielding electrode BMLa may also receive the first power voltage ELVDD. The first shielding electrode BMLa may block an electrical potential caused by a polarization phenomenon from affecting the silicon transistor S-TFT. The first shielding electrode BMLa may block external light from arriving at the silicon transistor S-TFT. In an embodiment of the inventive concept, the first shielding electrode BMLa may be a floating electrode that is isolated from another electrode or line.

A buffer layer 10*bf* may be disposed on the barrier layer 10*br*. The buffer layer 10*bf* may prevent metal atoms or impurities from being diffused from the base layer 110 to a first semiconductor pattern SC1 disposed thereabove. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. For example, the silicon semiconductor may include amorphous silicon and polycrystalline silicon. For example, the first semiconductor pattern SC1 may include a low temperature polysilicon.

FIG. 7 merely illustrates a portion of the first semiconductor pattern SC1, and the first semiconductor pattern SC1 may be further disposed on another area. The first semiconductor pattern SC1 may be arranged over pixels with a particular rule. The first semiconductor pattern SC1 may have an electrical property that is changed according to whether it is doped or not. The first semiconductor pattern SC1 may include a first area having a high conductivity and a second area having a low conductivity. The first area may be doped with an n-type dopant or a p-type dopant. A p-type transistor may include a doped area that is doped with the p-type dopant, and an n-type transistor may include a doped area that is doped with the n-type dopant. The second area may be a non-doped area or a doped area having a concentration less than that of the first area.

The first area of the first semiconductor pattern SC1 may have a conductivity greater than that of the second area and serve as an electrode or a signal line. The second area of the first semiconductor pattern SC1 may correspond to a channel region (or an active region) of the transistor. In other words, one portion of the first semiconductor pattern SC1 may be a channel of the transistor, another portion of the first semiconductor pattern SC1 may be a source or a drain of the transistor, and another portion of the first semiconductor pattern SC1 may be a connection electrode or a connection signal line.

A source region SE1, a channel region AC1 (or an active region), and a drain region DE1 of the silicon transistor S-TFT may be provided from the first semiconductor pattern SC1. The source region SE1 and the drain region DE1 may extend in opposite directions from the channel region AC1 on a cross-section.

A first insulation layer 10 may be disposed on the buffer layer 10*bf*. The first insulation layer 10 may cover the first semiconductor pattern SC1. The first insulation layer 10 may be an inorganic layer. The first insulation layer 10 may include at least one of an aluminum oxide, a titanium oxide, a silicon oxide, a silicon nitride, a silicon oxynitride, a zirconium oxide, and a hafnium oxide.

The first insulation layer 10 may be a single layered silicon oxide layer. Instead of the first insulation layer 10, an inorganic layer of the circuit layer 120, which will be described later, may have a single layered or multiple layered structure and include at least one of the above-described materials. However, the inventive concept is not limited thereto.

A gate GT1 of the silicon transistor S-TFT is disposed on the first insulation layer 10. The gate GT1 may be a portion of a metal pattern. The gate GT1 overlaps the channel region AC1. The gate GT1 may serve as a mask in a process of doping the first semiconductor pattern SC1. The gate GT1 may include molybdenum (Mo) having excellent heat resistance, an alloy containing molybdenum, titanium (Ti), or an alloy containing titanium. However, the inventive concept is not limited thereto.

The first electrode CE10 of the capacitor Cst is disposed on the first insulation layer 10. Unlike as illustrated in FIG. 6, the first electrode CE10 may have a shape integrated with the gate GT1.

A second insulation layer 20 may be disposed on the first insulation layer 10 to cover the gate GT1. An upper electrode (not shown) overlapping the gate GT1 may be disposed on the second insulation layer 20. The second electrode CE20 overlapping the first electrode CE10 may be disposed on the second insulation layer 20. The second electrode CE20 may include molybdenum (Mo) having excellent heat resistance, an alloy containing molybdenum, titanium (Ti), or an alloy containing titanium. The upper electrode may be formed by the same process as the second electrode CE and the upper electrode may include the same material as the second electrode CE.

A second shielding electrode BMLb is disposed on the second insulation layer 20. The second shielding electrode BMLb may be disposed in correspondence to a lower portion of the oxide transistor O-TFT. In an embodiment of the inventive concept, the second shielding electrode BMLb may be omitted. According to an embodiment of the inventive concept, the first shielding electrode BMLa may extend until the lower portion of the oxide transistor O-TFT to replace the second shielding electrode BMLb.

A third insulation layer 30 may be disposed on the second insulation layer 20. A second semiconductor pattern SC2 may be disposed on the third insulation layer 30. The second semiconductor pattern SC2 may include a channel region AC2 of the oxide transistor O-TFT. The second semiconductor pattern SC2 may include an oxide semiconductor. The second semiconductor pattern SC2 may include a transparent conductive oxide (TCO) such as an indium tin oxide (ITO), an indium zinc oxide (IZO), an Indium gallium zinc oxide (IGZO), a zinc oxide (ZnOx) or an indium oxide ($In_2O_3$).

The oxide semiconductor may include a plurality of regions that are distinguished according to whether the transparent conductive oxide is reduced. A region (hereinafter, referred to as a reduction region) in which the transparent conductive oxide is reduced has a conductivity greater than that of a region (hereinafter, referred to as a non-reduction region) in which the transparent conductive oxide is not reduced. The reduction region serves as the source or drain of the transistor or the signal line. The non-reduction region corresponds to a semiconductor region (or a channel) of the transistor. In other words, one region of the second semiconductor pattern SC2 may be the semiconductor region of the transistor, another region of the second semiconductor pattern SC2 may be the source or drain region of the transistor, and another region of the second semiconductor pattern SC2 may be a signal transmission region.

A fourth insulation layer 40 may be disposed on the third insulation layer 30. As illustrated in FIG. 6, the fourth insulation layer 40 may be an insulation pattern that overlaps a gate GT2 of the oxide transistor O-TFT and exposes the source region SE2 and the drain region DE2 of the oxide transistor O-TFT. In an embodiment of the inventive concept, the fourth insulation layer 40 may overlap a plurality of pixels in common and cover the second semiconductor pattern SC2.

The gate GT2 of the oxide transistor O-TFT is disposed on the fourth insulation layer 40. The gate GT2 of the oxide transistor O-TFT may be a portion of the metal pattern. The gate GT2 of the oxide transistor O-TFT overlaps the channel region AC2. The gate GT2 may include molybdenum (Mo) having excellent heat resistance, an alloy containing molybdenum, titanium (Ti), or an alloy containing titanium. The gate GT2 may include a titanium layer and a molybdenum layer disposed on the titanium layer.

A fifth insulation layer 50 may be disposed on the fourth insulation layer 40 to cover the gate GT2. Each of the first insulation layer 10 to the fifth insulation layer 50 may be an inorganic layer.

A first connection electrode CNE1 may be disposed on the fifth insulation layer 50. The first connection electrode CNE1 may be connected to the drain region DE1 of the silicon transistor S-TFT through a contact hole passing through the first to fifth insulation layers 10, 20, 30, 40, and 50.

A sixth insulation layer 60 may be disposed on the fifth insulation layer 50. A second connection electrode CNE2 may be disposed on the sixth insulation layer 60. The second connection electrode CNE2 may be connected to the first connection electrode CNE1 through a contact hole passing through the sixth insulation layer 60. A data line DL may be disposed on the sixth insulation layer 60. A seventh insulation layer 70 may be disposed on the sixth insulation layer 60 to cover the second connection electrode CNE2 and the data line DL. An eighth insulation layer 80 may be disposed on the seventh insulation layer 70. Each of the first connection electrode CNE1, the second connection electrode CNE2, and the data line DL may include molybdenum, silver, titanium, copper, aluminum, or an alloy thereof.

Each of the sixth insulation layer 60, the seventh insulation layer 70, and the eighth insulation layer 80 may be an organic layer. For example, each of the sixth insulation layer 60, the seventh insulation layer 70, and the eighth insulation layer 80 may include a polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a mixture thereof:

The third light emitting element LD3 may include the anode AE3 (or first electrode), a light emitting layer EL3, and the cathode electrode CE (or second electrode). A cathode CE of each of the light emitting element LD1 and the second light emitting element LD2, which will be described later, may have a shape integrated with a cathode CE of the third light emitting element LD3. In other words, the cathode CE may be provided to the first light emitting element LD1, the second light emitting element LD2, and the third light emitting element LD3 in common.

The anode AE3 of the third light emitting element LD3 may be disposed on the eighth insulation layer 80. The anode AE3 of the third light emitting element LD3 may be a (semi) transmissive electrode or a reflective electrode. According to an embodiment of the inventive concept, the anode AE3 of the third light emitting element LD3 may include a reflective layer made of Ag, Mg, Al, Pt, Pd, Au, Ni, Nd, Ir, Cr or a compound thereof and a transparent or semitransparent electrode layer disposed on the reflective layer. The transparent or semitransparent electrode layer may include at least one selected from the group consisting of an indium tin oxide (ITO), an indium zinc oxide (IZO), an Indium gallium zinc oxide (IGZO), a zinc oxide (ZnOx), an indium oxide ($In_2O$), or an aluminum doped zinc oxide. For example, the anode AE3 of the third light emitting element LD3 may include a laminated structure of ITO/Ag/ITO.

A pixel defining layer PDL may be disposed on the eighth insulation layer 80. The pixel defining layer PDL may include the same material and be provided through the same process as the eighth insulation layer 80. The pixel defining layer PDL may have a light absorption property and have, e.g., a black color. The pixel defining layer PDL may include a black coloring agent. The black coloring agent may include a black pigment and a black dye. The black coloring agent may include metal such as chrome and carbon black or an oxide thereof. The pixel defining layer PDL may correspond to a light shielding pattern having a light shielding characteristic.

The pixel defining layer PDL may cover a portion of the anode AE3 of the third light emitting element LD3. For example, a second opening PDL-OP2 for exposing a portion of the anode AE3 of the third light emitting element LD3 may be provided in the pixel defining layer PDL. The pixel defining layer PDL may increase a distance between an edge of the anode AE3 and the cathode CE of the third light emitting element LD3. Thus, the pixel defining layer PDL may prevent arc from being generated at the edge of the anode AE3 of the third light emitting element LD3.

A hole control layer may be disposed between the anode AE3 and the light emitting layer EL3. The hole control layer may include a hole transport layer and further include a hole injection layer. An electron control layer may be disposed between the light emitting layer EL3 and the cathode CE. The electron control layer may include an electron transport layer and further include an electron injection layer. The hole control layer and the electron control layer may be provided to the plurality of pixels PX (refer to FIG. 5A) in common by using an open mask.

The encapsulation layer 140 may be disposed on the light emitting element layer 130. Although the encapsulation layer 140 may include an inorganic layer 141, an organic layer 142, and an inorganic layer 143, which are sequentially laminated, the inventive concept is not limited to the layers constituting the encapsulation layer 140.

The inorganic layers 141 and 143 may protect the light emitting element layer 130 from moisture and oxygen, and the organic layer 142 may protect the light emitting element layer 130 from foreign substances such as dust particles. The inorganic layers 141 and 143 may include a silicon nitride layer, a silicon oxynitride layer, a silicon oxide layer, a titanium oxide layer, or an aluminum oxide layer. Although the organic layer 142 may include an acrylic-based organic layer, the inventive concept is not limited thereto.

The sensor layer SSL may be disposed on the display panel DP. The sensor layer SSL may include at least one conductive layer and at least one insulation layer. In this embodiment, the sensor layer SSL may include a first insulation layer 210, a first conductive layer 220, a second insulation layer 220, and a second conductive layer 240.

The first insulation layer 210 may be disposed directly on the display panel DP. The first insulation layer 210 may be an inorganic layer including at least one of a silicon nitride, a silicon oxynitride, and a silicon oxide. Alternatively, the first insulation layer 210 may be an organic layer including an epoxy resin, an acrylic resin, or imide-based resin. The first insulation layer 210 may have a single layered structure or a multiple layered structure that is laminated in the third direction DR3. The first conductive layer 220 may protrude from a surface of the first insulation layer 210.

Each of the first conductive layer 220 and the second conductive layer 240 may have the single layered structure or the multiple layered structure that is laminated in the third direction DR3. Each of the first conductive layer 220 and the second conductive layer 240 may include conductive lines forming a mesh-type electrode. The conductive line of the first conductive layer 220 and the conductive line of the second conductive layer 240 may be connected through a contact hole passing through the second insulation layer 230 or may not be connected. A connection relationship between the conductive line of the first conductive layer 220 and the conductive line of the second conductive layer 240 may be determined according to the kind of sensors constituting the sensor layer SSL.

Each of the first conductive layer 220 and the second conductive layer 240, which have the single layered structure, may include a metal layer or a transparent conductive layer. The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnOx), or an indium zinc tin oxide (IZTO). In addition, the transparent conductive layer may include a conductive polymer such as PEDOT, a metal nano-wire, or a graphene.

Each of the first conductive layer 220 and the second conductive layer 240, which have the multiple layered structure, may include metal layers. The metal layers may have, e.g., a three layered structure of titanium/aluminum/titanium. The multiple layered conductive layer may include at least one metal layer and at least one transparent conductive layer.

The second insulation layer 230 may be disposed between the first conductive layer 220 and the second conductive layer 240. For example, the first and second conductive layers 220 and 240 may overlap each other with the second insulation layer 230 therebetween. In addition, the second conductive layer 240 may protrude from a surface of the second insulation layer 230. The second insulation layer 230 may include an inorganic layer. The inorganic layer may include at least one of an aluminum oxide, a titanium oxide, a silicon oxide, a silicon nitride, a silicon oxynitride, a zirconium oxide, and a hafnium oxide.

Alternatively, the second insulation layer 230 may include an organic layer. The organic layer may include at least one of an acrylic-based resin, a methacrylic-based resin, a poly-isoprene-based resin, a vinyl-based resin, an epoxy-based resin, a urethane-based resin, a cellulose-based resin, a siloxane-based resin, a polyimide-based resin, a polyamide-based resin, or a perylene-based resin.

The anti-reflection layer ARL may be disposed on the sensor layer SSL. The anti-reflection layer ARL may include a division layer 310, a first color filter 321 (refer to FIG. 7), a second color filter 322 (refer to FIG. 7), a third color filter 323, and a flattening layer 330.

The division layer 310 may be made of various light absorption materials. However, the inventive concept is not limited thereto. The division layer 310 may have a black color. In an embodiment of the inventive concept, the division layer 310 may include a black coloring agent. The black coloring agent may include a black pigment and a black dye. The black coloring agent may include metal such as chrome and carbon black or an oxide thereof.

The division layer 310 may cover the second conductive layer 240 of the sensor layer SSL The division layer 310 may prevent external light reflection caused by the second conductive layer 240. The division layer 310 may overlap the second area DP-A2 (refer to FIG. 7) and the third area DP-A3 and may not overlap the first area DP-A1 (refer to FIG. 7). In other words, since the division layer 310 is not disposed on the first area DP-A1 (refer to FIG. 7), the first area DP-A1 may have a further increased transmittance.

A second opening 310-OP2 may be provided in the division layer 310. The second opening 310-OP2 may overlap the anode AE3 of the third light emitting element LD3. The third color filter 323 may overlap the third area DP-A3. The third color filter 323 may overlap the anode AE3 of the third light emitting element LD3. The third color filter 323 may cover the second opening 310-OP2. The third color filter 323 may contact the division layer 310.

The flattening layer 330 may cover the division layer 310 and the third color filter 323. The flattening layer 330 may include an organic material and provide a flattening surface on a top surface thereof. In an embodiment of the inventive concept, the flattening layer 330 may be omitted.

In FIG. 7, the second area DP-A2 to which the fourth insulation layer 40 having the insulation pattern in FIG. 6 is applied is illustrated. In FIG. 7, the oxide transistor O-TFT of the second pixel circuit PC2 is not illustrated unlike the first pixel circuit PCL. A description on the first group pixel PX1 and the second group pixel PX2 that are common with the third group pixel PX3 described with reference to FIG. 6 will be omitted.

The anode AE1 of the first light emitting element LD1 may be electrically connected to the first pixel circuit PC1 disposed on the second area DP-A2. The anode AE1 of the first light emitting element LD1 may be electrically connected to the silicon transistor S-TFT or the oxide transistor O-TFT. The anode AE1 of the first light emitting element LD1 connected to the silicon transistor S-TFT is illustrated in FIG. 7.

The anode AE1 of the first light emitting element LD1 may be electrically connected to the first pixel circuit PC1 through the pixel connection line TWL and connection electrodes CNE1' and CNE2'. According to an embodiment of the inventive concept, one of the connection electrodes CNE1' and CNE2' may be omitted.

The pixel connection line TWL may include a transparent conductive material. For example, the pixel connection line TWL may include a transparent conductive oxide (TCO) such as an indium tin oxide (ITO), an indium zinc oxide (IZO), an Indium gallium zinc oxide (IGZO), a zinc oxide (ZnOx) or an indium oxide ($In_2O_3$). Although the pixel connection line TWL overlaps the transmission area TA through which an optical signal moves, the pixel connection line TWL may minimize deformation of the optical signal such as diffraction.

In this embodiment, the pixel connection line TWL (hereinafter, a first pixel connection line) overlaps the first area DP-A1 and the second area DP-A2 and is disposed between the seventh insulation layer 70 and the eighth insulation layer 80. In other words, the first pixel connection line TWL extends from the first area DP-A1 to the second area DP-A2. The first pixel connection line TWL does not overlap the third area DP-A3 (refer to FIG. 6). In other words, the first pixel connection line TWL is not provided in the third area DP-A3.

The display panel DP according to an embodiment of the inventive concept may further include a connection line TWL1 (hereinafter, a second pixel connection line) disposed between the sixth insulation layer 60 and the seventh insulation layer 70 or a connection line TWL2 (hereinafter, a third pixel connection line) disposed between the fifth insulation layer 50 and the sixth insulation layer 60. According to an embodiment of the inventive concept, the display panel DP may include at least one of the first, second, and third pixel connection lines TWL, TWL2, and TWL2. The second and third pixel connection lines TWL2 and TWL3 may overlap each other.

The pixel defining layer PDL may cover a portion of the anode AE2 of the second light emitting element LD2. For example, a first opening PDL-OP1 for exposing a portion of the anode AE2 of the second light emitting element LD2 may be provided in the pixel defining layer PDL.

A pixel defining pattern PDP may be disposed on the eighth insulation layer 80 to overlap the first area DP-A1. The pixel defining layer PDL may include the same material and provided through the same process as the pixel defining layer PDL. The pixel defining pattern PDP may cover a portion of the anode AE1 of the first light emitting element LD1. An opening PDP-OP for exposing a portion of the anode AE1 of the first light emitting element LD1 may be provided in the pixel defining pattern PDP.

Although the pixel defining pattern PDP is distinguished from the pixel defining layer PDL in this embodiment, the pixel defining pattern PDP may be a portion of the pixel defining layer PDL. The pixel defining layer PDL may be a first portion of a patterned insulation layer, and the pixel defining pattern PDP may be a second portion of the patterned insulation layer. The insulation layer including the pixel defining pattern PDP and the pixel defining layer PDL may include an organic layer.

The pixel defining pattern PDP may cover an edge of the anode AE1 of the first light emitting element LD1 and prevent arc from being generated like the pixel defining layer PDL. An area overlapping a portion on which the anode AE1 of the first light emitting element LD1 and the pixel defining pattern PDP are disposed in the first area DP-A1 may be a light shielding area LSA, and the area adjacent to the light shielding area LSA in which the first light emitting element LD1 is not provided may be the transmission area TA.

A first opening 310-OP1 may be provided in the division layer 310. The first opening 310-OP1 may overlap the anode AE2 of the second light emitting element LD2. The first color filter 321 may overlap the first area DP-A1, and the second color filter 322 may overlap the second area DP-A2. Each of the first color filter 321 and the second color filter 322 may overlap the corresponding anode of the anodes AE1 and AE2.

Since the division layer 310 does not overlap the first area DP-A1, the first color filter 321 may be spaced apart from the division layer 310. In other words, the first color filter 321 may not contact the division layer 310. The second color filter 322 may cover the first opening 310-OP1. The flattening layer 330 may cover the division layer 310, the first color filter 321, and the second color filter 322.

Figure 8A:
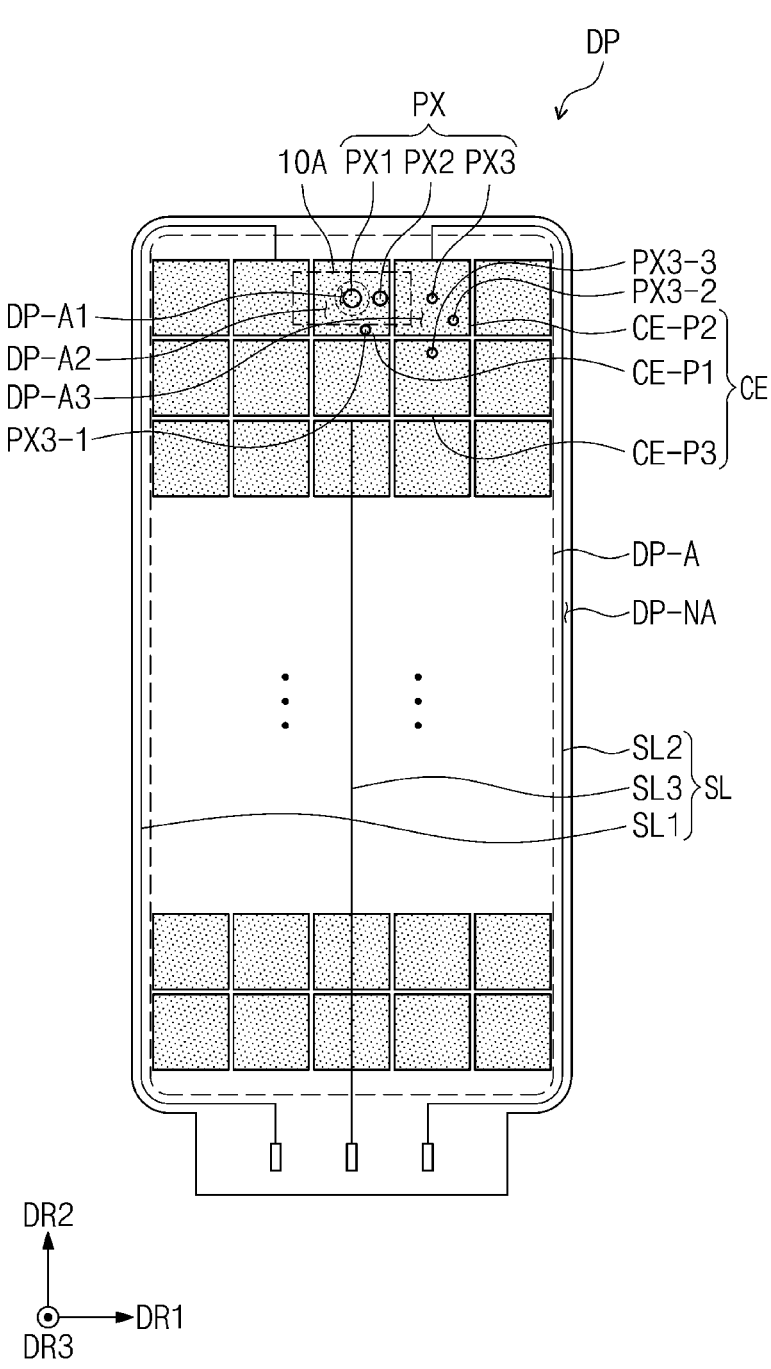
FIG. 8A is a plan view illustrating a cathode of the display panel according to an embodiment of the inventive concept.
Figure 8B:
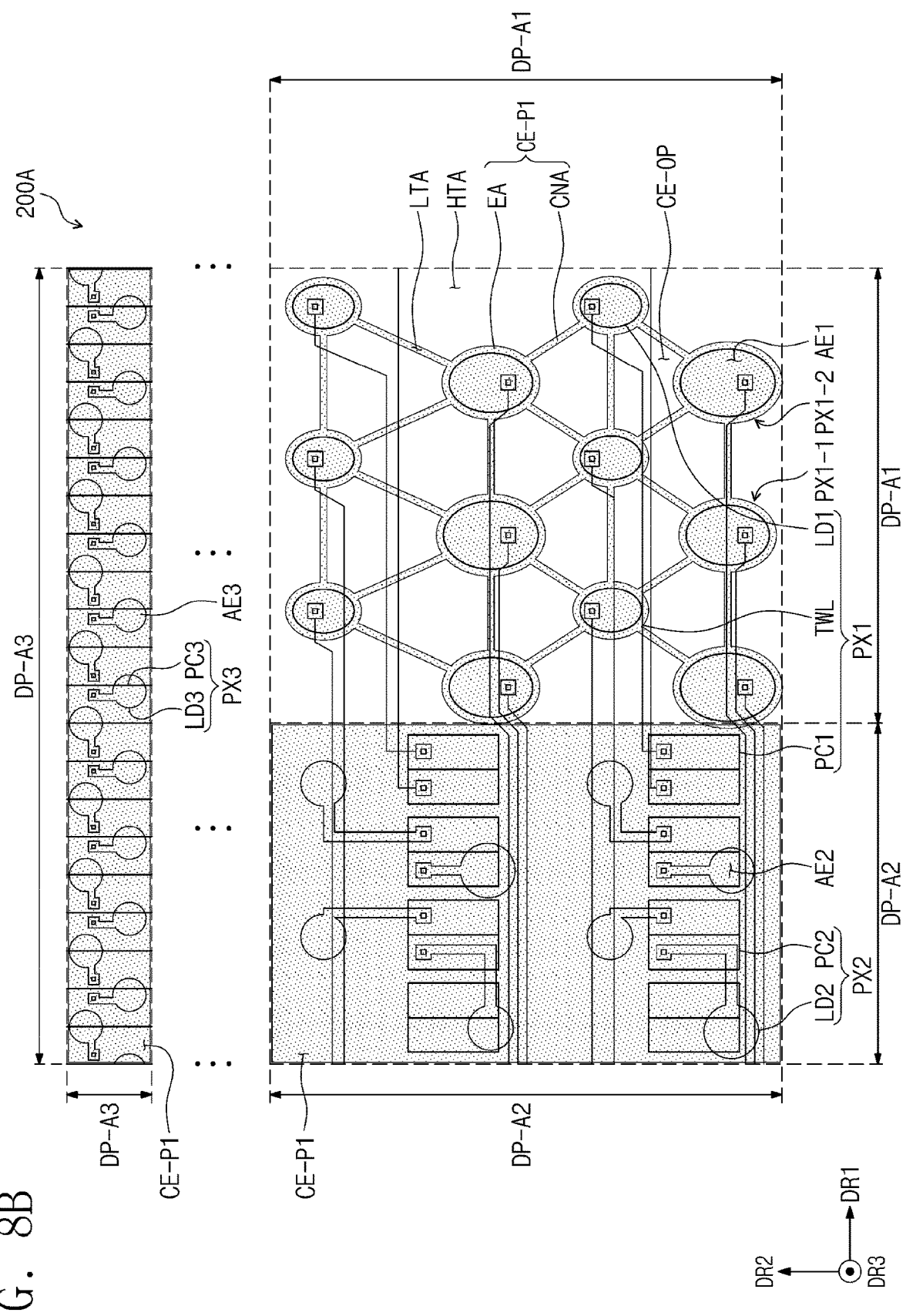
FIGS. 8B and 8C are enlarged plan views illustrating a portion of the display panel according to an embodiment of the inventive concept.
Figure 8C:
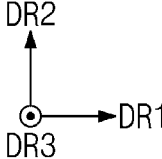
Figure 8D:
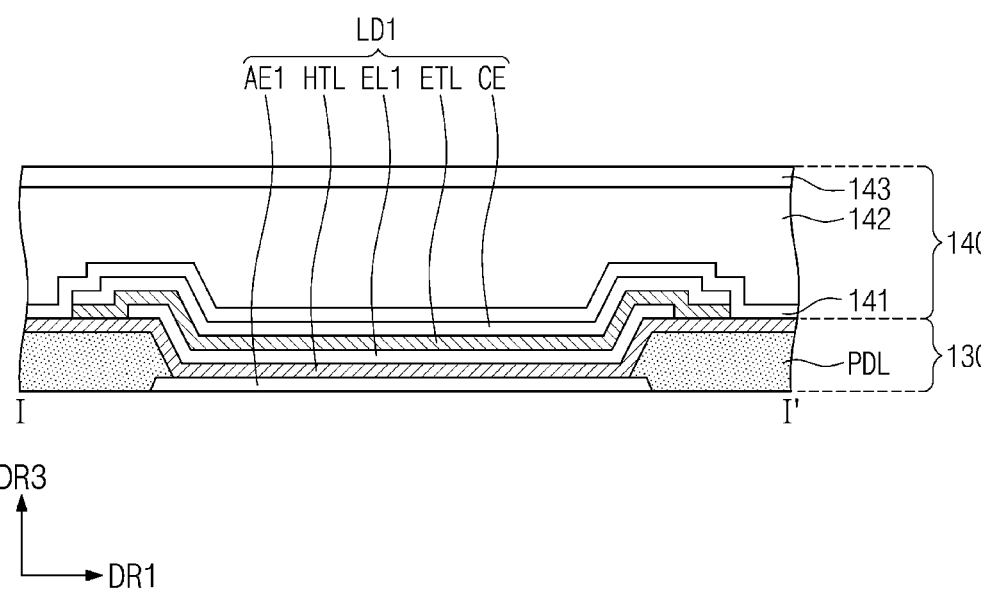
FIG. 8D is a cross-sectional view taken long line I-I' of FIG. 8C.
Figure 8E:
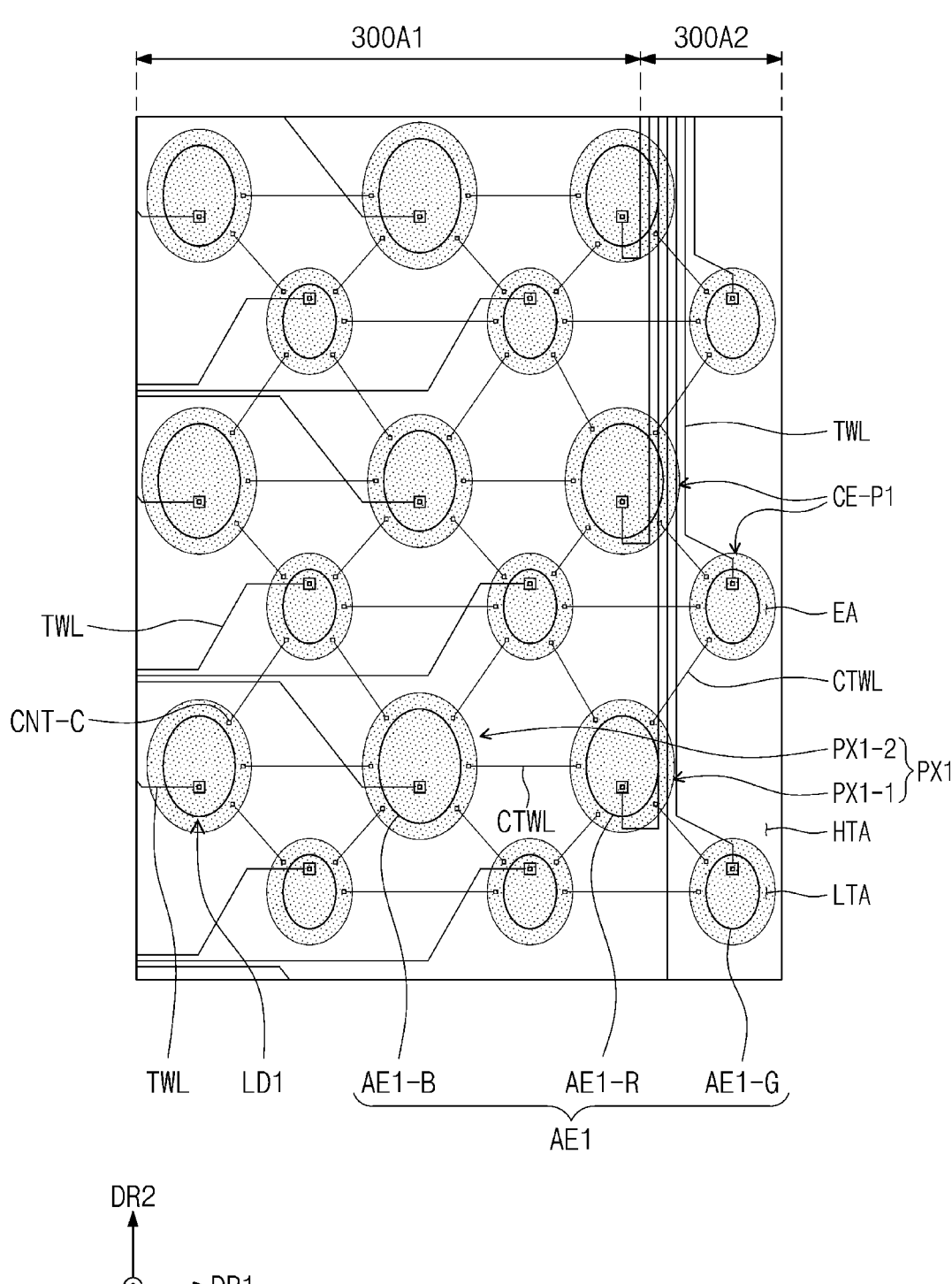
FIG. 8E is an enlarged plan view illustrating a portion of the display panel according to an embodiment of the inventive concept.

FIG. 8A is a plan view illustrating the cathode CE of the display panel DP according to an embodiment of the inventive concept. FIGS. 8B and 8C are enlarged plan views illustrating a portion of the display panel DP according to an embodiment of the inventive concept. FIG. 8D is a cross-sectional view taken long line I-I' of FIG. 8C. FIG. 8E is an enlarged plan view of a portion of the display panel DP according to an embodiment of the inventive concept.

As illustrated in FIG. 8A, the cathode CE may include a plurality of patterns CE-P1, CE-P2, and CE-P3. Each of the plurality of patterns CE-P1, CE-P2, and CE-P3 may correspond to the plurality of pixels PX.

The cathode CE including the plurality of patterns CE-P1, CE-P2, and CE-P3 may be provided by various methods. For example, the cathode CE may be provided by an inkjet printing method. The cathode CE may be provided by depositing a conductive material on a specific area by using a mask.

The plurality of patterns CE-P1, CE-P2, and CE-P3 may correspond to the cathode during the first period T10 in FIG. 4B. The plurality of patterns CE-P1, CE-P2, and CE-P3 may correspond to an electrode of the input sensor during the second period T20 in FIG. 4B. Each of the plurality of patterns CE-P1, CE-P2, and CE-P3 may receive the driving signal TDS during the second period T20. More specifically, the plurality of patterns CE-Pt, CE-P2, and CE-P3 may be driven by a self-cap (or self-capacitance) method. An additional capacitor is connected in parallel to a capacitor in each of the plurality of patterns CE-P1, CE-P2, and CE-P3 in the pattern on which a user's input is generated. A driving circuit of the input sensor may distinguish the user's input by measuring a change amount of a capacitance generated in the plurality of patterns CE-P1, CE-P2, and CE-P3.

The plurality of patterns CE-P1, CE-P2, and CE-P3 may include a first pattern CE-P1 overlapping the first area DP-A1, a second pattern CE-P2 overlapping the second area DP-A2, and a third pattern CE-P3 overlapping the third area DP-A3. Although one first pattern CE-P1 and two second patterns CE-P2 are illustrated as an example, the number of each of the first pattern CE-P1 and the second pattern CE-P2 may be changed.

Each of the first pattern CE-P1, the second pattern CE-P2, and the third pattern CE-P3 is connected to the signal line SL. The signal line SL may provide the second power voltage ELVSS (refer to FIG. 4B) and the driving signal TDS (refer to FIG. 4B) to each of the first pattern CE-P1, the second pattern CE-P2, and the third pattern CE-P3. The signal line SL is connected to a pad PD connected to the flexible circuit board FCB in FIG. 2A.

The signal line SL may be disposed on the same layer and include the same material as one of the first, second, and third pixel connection lines TWL, TWL1, and TWL2 described with reference to FIG. 7. The signal line SL may be disposed on the same layer and include the same material as the data line DL in FIG. 7. The signal line SL may be disposed on the same layer as the conductive patterns disposed on different layers in FIG. 7.

A first signal line SL1 and a second signal line SL2 respectively connected to the first pattern CE-P1 and the second pattern CE-P2 are mostly disposed on the peripheral area DP-NA. The signal line connected to the pattern adjacent to the peripheral area DP-NA is mostly disposed on the peripheral area DP-NA. The third signal line SL3 connected to the third pattern CE-P3 is mostly disposed on the display area DP-A. Each of the first signal line SL1 and the second signal line SL2 may be changed into the same shape as the third signal line SL3.

Referring to FIG. 8A, the first pattern CE-P1 may be a common cathode of the first group pixel PX1, the second group pixel PX2, and the third group pixel PX3. The second pattern CE-P2 may be a common cathode of the second group pixel PX2 and the third group pixel PX3. The third pattern CE-P3 may be a cathode of the third group pixel PX3. A pixel PX3-1 of the third group pixel PX3 includes the cathode of the first pattern CE-P1, another pixel PX3-2 of the third group pixel PX3 includes the cathode of the second pattern CE-P2, and the another pixel PX3-3 of the third group pixel PX3 includes the cathode of the third pattern CE-P3.

In FIGS. 8B and 8C, the cathode CE in FIGS. 5C and 5D is additionally illustrated. FIG. 8C is an enlarged view illustrating a partial area of FIG. 5D. A detailed shape of the first pattern CE-P1 of FIG. 8A is enlarged in FIGS. 8B and 8C.

Referring to FIG. 8B, the first pattern CE-P1 may correspond to the common cathode of the first group pixel PX1, the second group pixel PX2, and the third group pixel PX3.

The first pattern CE-P1 may overlap an entire area corresponding to the third area DP-A3. The corresponding area may be shown in FIG. 8A. The first pattern CE-P1 may overlap the third light emitting elements LD3 and the third pixel circuit PC3 disposed on the third area DP-A3.

The first pattern CE-P1 may overlap an entire area corresponding to the second area DP-A2. The corresponding area may be shown in FIG. 8A. The first pattern CE-P1 may overlap the second light emitting elements LD2, the second pixel circuit PC2, and the first pixel circuit PC1 disposed on the second area DP-A2. In addition, the first pattern CE-Pt may overlap anode AE2. The cathode of the third light emitting elements LD3 and the cathode of the second light emitting elements LD2 may be electrically connected in an area on which the first pattern CE-P1 is disposed. The cathode of the second light emitting elements LD2 and the cathode of the first light emitting elements LD1 may be electrically connected in the area on which the first pattern CE-P1 is disposed. As illustrated in FIGS. 8A and 8B, the cathode of the first light emitting elements LD1, the cathode of the second light emitting elements LD2, and the cathode of the third light emitting elements LD3 may have an integrated shape in the area on which the first pattern CE-P1 is disposed.

Referring to FIGS. 8B and 8C, the first pattern CE-P1 is patterned in the first area DP-A1. In other words, the first area DP-A1 may be distinguished into an area LTA (hereinafter, referred to as a low transmittance area) on which the first pattern CE-P1 is disposed and an area HTA (hereinafter, referred to as a high transmittance area) on which the first pattern CE-P1 is not disposed.

Although the first pattern CE-P1 is a transmissive or semi-transmissive electrode, a transmittance of the area on which the first pattern CE-P1 is disposed is reduced more than the area on which the first pattern CE-P1 is not disposed. As illustrated in FIGS. 8B and 8C, a transmittance of the area on which the first pattern CE-P1 is not disposed increases more than the low transmittance area LTA like the high transmittance area HTA.

The first pattern CE-P1 may include electrode areas EA overlapping the anodes AE1 of the first light emitting elements LD1 and connection areas CNA connecting the electrode areas EA. An opening CE-OP1 is provided in the first pattern CE-P1 in correspondence to the high transmittance area HTA. In other words, the opening CE-OP1 is provided in the high transmittance area HTA. Each of the electrode areas EA may have an area greater than that of the corresponding anode of the anodes AE1. Each of the anodes AE1 is disposed at an inner side of the corresponding electrode area EA.

The electrode area EA may correspond to the light shielding area LSA in FIG. 7. When the first pattern CE-P1 covers the pixel defining pattern PDP, the electrode area EA may have an area greater than that of the light shielding area LSA. In contrast, when an edge of the first pattern CE-P1 is disposed on the pixel defining pattern PDP, the electrode area EA may have an area less than that of the light shielding area LSA. This is illustrated in FIG. 9B.

Two pixels of the first group pixel PX1 will be mainly described in more detail with reference to FIG. 8C. A first pixel PX1-1 may include the first light emitting element LD1 having the first color and including a first anode AE1-R, and a second pixel PX1-2 may include the first light emitting element LD1 having the third color and including a third anode AE1-B The electrode area EA of the first pixel PX1-1 and the electrode area EA of the second pixel PX1-2 are connected through the connection area CNA. The electrode area EA of the first pixel PX1-1, the electrode area EA of the second pixel PX1-2, and the connection area CNA may have an integrated shape. The electrode area EA of the first pixel PX1-1, the electrode area EA of the second pixel PX1-2, and the connection area CNA, which have the integrated shape, correspond to a common cathode of the first pixel PX-14 and the second pixel PX1-2.

FIG. 8D is a cross-sectional view taken long line I-I' of FIG. 8C and illustrating the light emitting element layer 130. A different point from the light emitting element layer 130 in FIG. 7 will be mainly described.

A hole transport layer HTL may be further disposed between the anode AE1 and the light emitting layer ELI. The hole transport layer HTL overlaps the light emitting layer ELI and the pixel defining layer PDL. The hole transport layer HTL may overlap the entire first area DP-A1 in FIG. 8C and the entire display area DP-A in FIG. 8A.

An electron transport layer ETL may be disposed between the light emitting layer ELI and the cathode CE. The electron transport layer ETL may have a predetermined shape instead of overlapping the entire first area DP-A1. Substantially, the electron transport layer ETL and the cathode CE may have the same shape when viewed on a plane. The electron transport layer ETL may include an area corresponding to the connection area CNA and an area corresponding to the electrode area EA in FIG. 8C. In other words, the electron transport layer ETL may overlap the low transmittance area LTA and may not overlap the high transmittance area HTA in FIG. 8C.

The electron transport layer ETL and the cathode CE may have the same shape on the plane for a reason to be described later. Whether a material of the cathode CE, e.g., magnesium, is deposited may be determined according to a surface state of the base layer on which the material is deposited. The magnesium may be deposited on the electron transport layer ETL, but may not be deposited on the hole transport layer HTL. Since the electron transport layer ETL and the hole transport layer HTL, which are made of different materials, have different surface properties, the magnesium may be selectively deposited only on the electron transport layer ETL. Deposition of the cathode may be determined by using the electron transport layer ETL without a separate mask.

FIG. 8E is a view illustrating the first pattern CE-Pi different from the embodiment in FIG. 8C. Referring to FIG. 8E, the first pattern CE-P1 may include only the electrode areas EA of FIG. 8C. Cathode connection lines CTWL may replace the connection areas CNA.

The first pixel PX1-1 and the second pixel PX1-2 will be mainly described in more detail. The cathode CE of the first pixel PX1-1 and the cathode CE of the second pixel PX1-2 are connected through the cathode connection lines CTWL. The cathode connection lines CTWL overlap the high transmittance area HTA.

The cathode connection lines CTWL may be disposed on the same layer and include the same material as one of the second and third pixel connection lines TWL1 and TWL2 in FIG. 7. The cathode connection lines CTWL may cross the first connection line TWL in FIG. 7 in an insulating manner.

The cathode connection lines CTWL may have a transmittance greater than a material of the first pattern CE-P1, e.g., the cathode CE. As an area occupied by the first pattern CE-P1 in the first area DP-A1 decreases, the transmittance of the first area DP-A1 may further increase.

A connection relationship between the electrode areas EA and the cathode connection lines CTWL refers to that between the signal line SL1 and the first pattern CE-P1 described with reference to FIGS. 9A and 9B. However, a contact hole CNT-C of the cathode connection lines CTWL and the electrode area EA may be provided in an area that does not overlap the pixel defining pattern PDP unlike a first contact hole CNT-1. The electrode area EA may further extend until the transmission area TA, and the contact hole CNT-C may be disposed in the transmission area TA.

According to an embodiment of the inventive concept, the display device DD includes: a display panel DP including: a base layer 110 including a display area DP-A including a first area DP-A1 through which an optical signal passes and a second area DP-A2 disposed adjacent to the first area DP-A1 and configured to block the optical signal, and a peripheral area DP-NA disposed adjacent to the display area DP-A; and a first group pixel PX1 and a second group pixel PX2 disposed on the base layer 110. The first group pixel PX1 includes a first pixel and a second pixel, each of the first pixel and the second pixel include a first light emitting element LD1 disposed on the first area DP-A1 and a first pixel circuit PC1 electrically connected to the first light emitting element LD1 and disposed on the second area DP-A2 or the peripheral area DP-NA. The first light emitting element LD1 comprises an anode AE1, a light emitting layer ELI disposed on the anode AE1, and a cathode CE disposed on the light emitting layer ELI, the cathode CE of the first pixel and the cathode of the second pixel are electrically connected, the first area DP-A1 comprises a low transmittance area LTA overlapping the cathode CE of the first pixel and the cathode CE of the second pixel and a high transmittance area HTA that does not overlap the cathode CE of the first pixel and the cathode CE of the second pixel, and each of the cathode CE of the first pixel and the cathode CE of the second pixel receives a power voltage ELVSS during a first period T10 and receives a driving signal TDS during a second period T20.

Figure 9A:
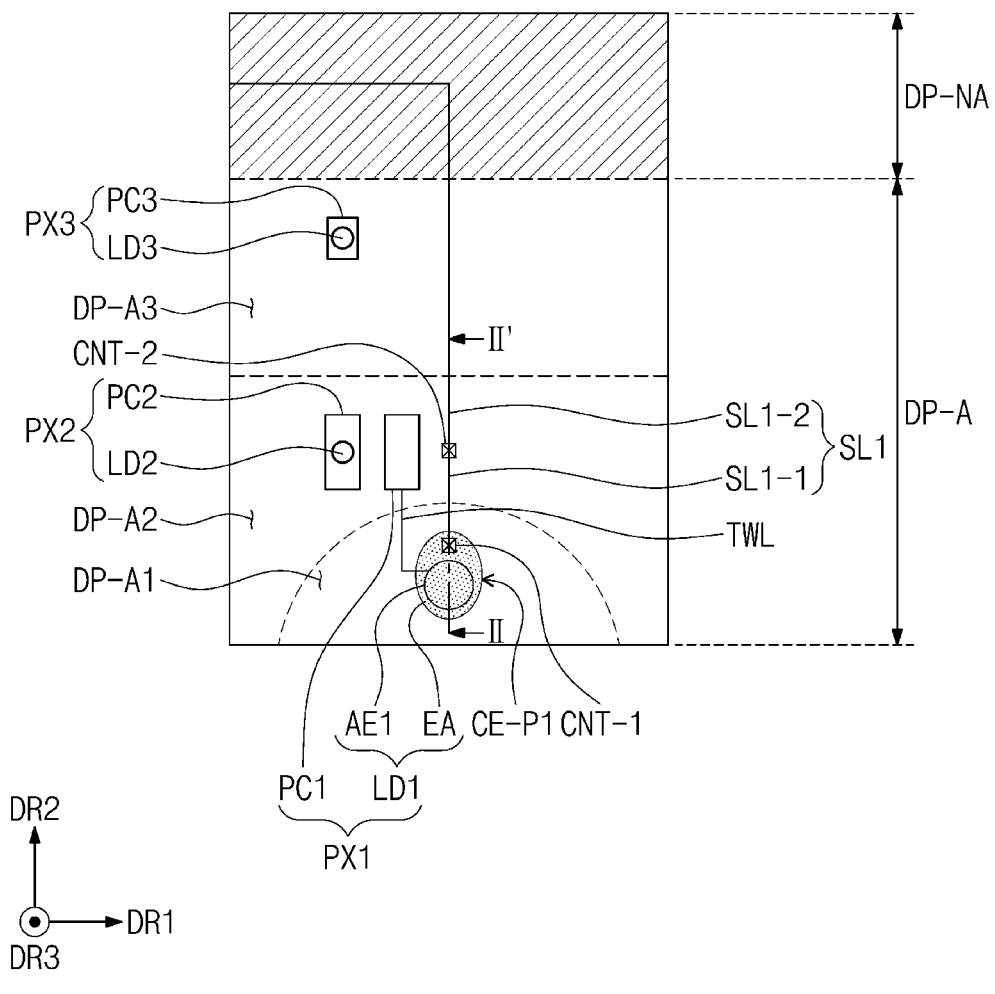
FIG. 9A is a plan view illustrating a signal line according to an embodiment of the inventive concept.
Figure 9B:
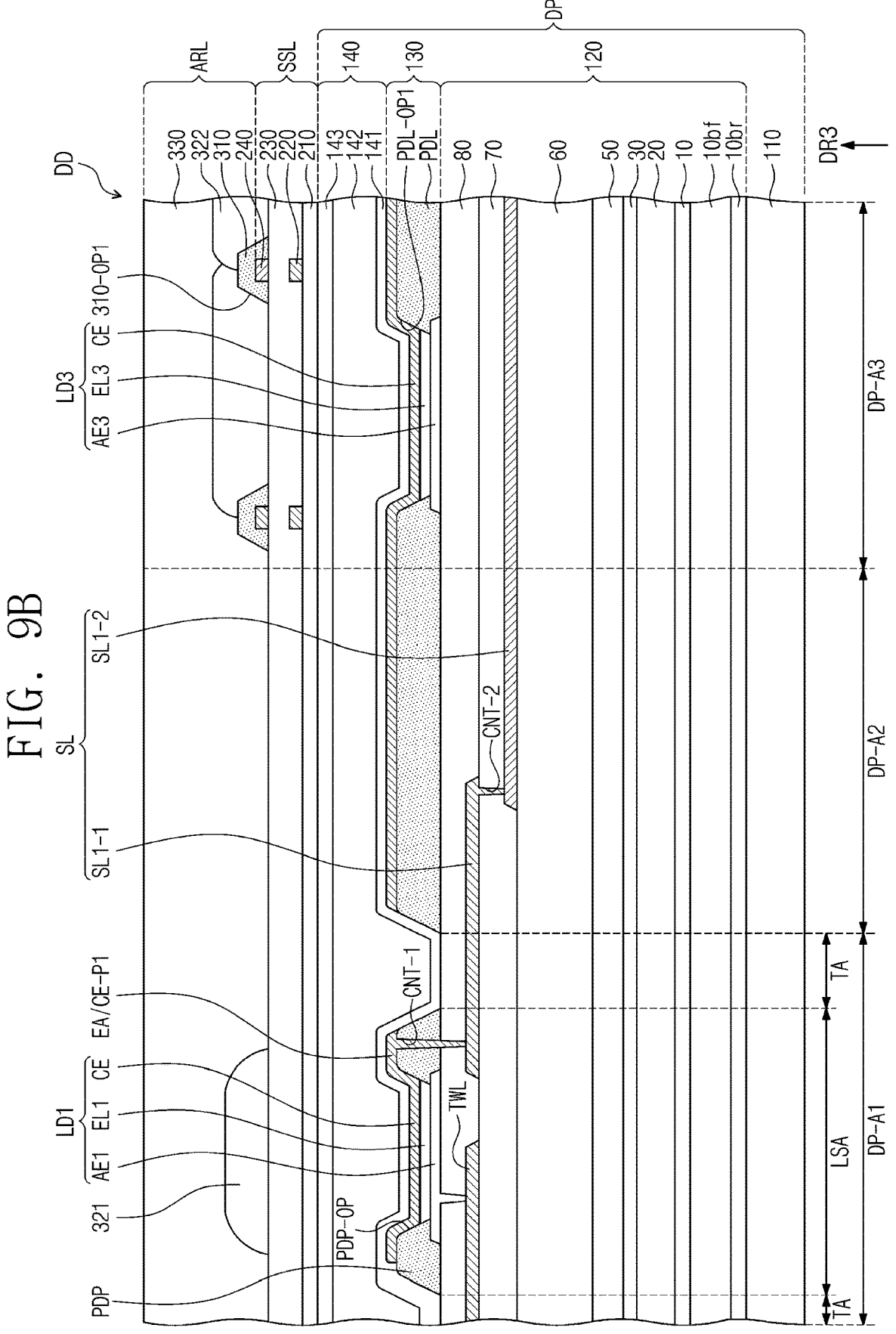
FIG. 9B is a cross-sectional view taken long line II-II' of FIG. 9A.
Figure 9C:
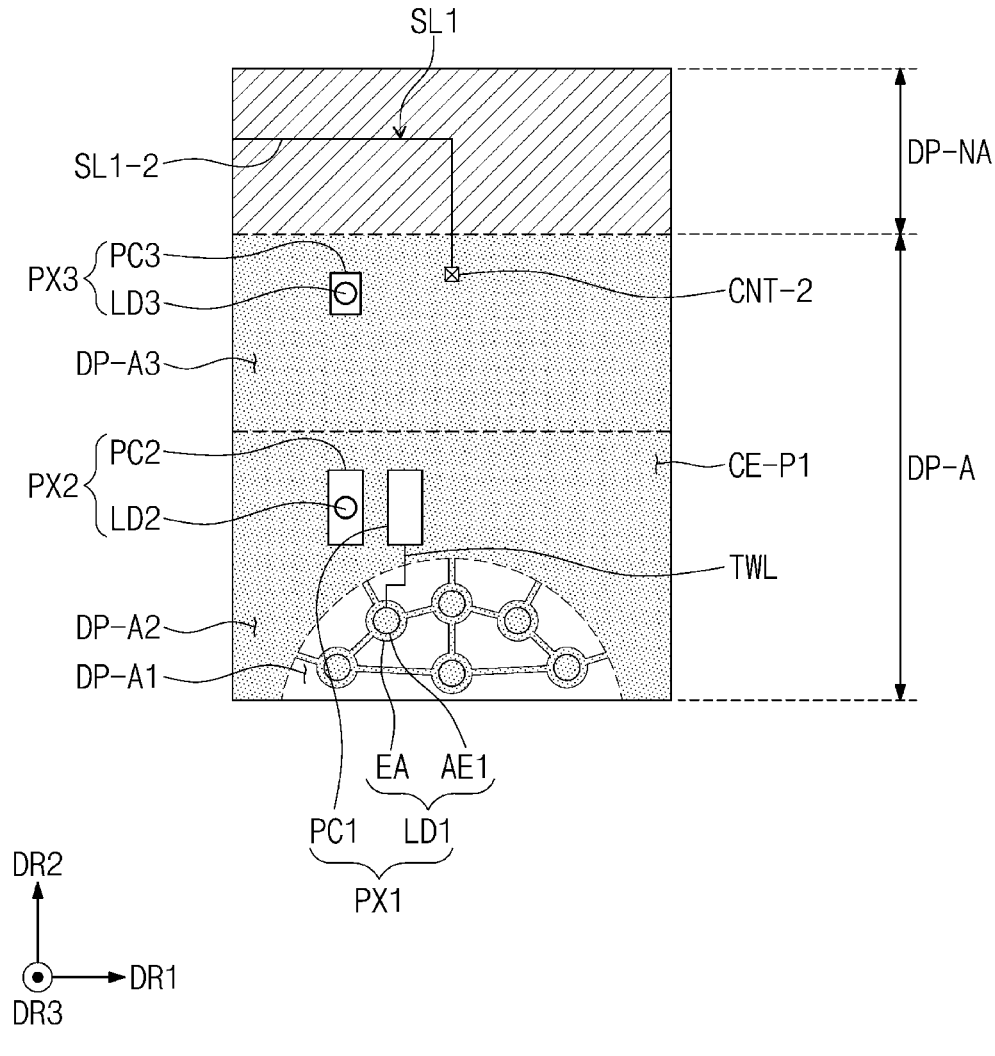
FIG. 9C is a plan view illustrating a signal line according to an embodiment of the inventive concept.

FIG. 9A is a plan view illustrating the signal line SL1 according to an embodiment of the inventive concept. FIG. 9B is a cross-sectional view taken long line II-11' of FIG. 9A. FIG. 9C is a plan view illustrating the signal line SL1 according to an embodiment of the inventive concept.

FIG. 9A is an enlarged plan view illustrating the connection relationship between the signal line SL1 and the first pattern CE-P1. In FIG. 9A, only a portion of the first pattern CE-P1 in the first area DP-A1 is illustrated, and one electrode area EA of the electrode areas in FIG. 8C is representatively illustrated. In FIG. 98, the second area DP-A2 is illustrated by only an area thereof, and the circuit layer 120 of the third area DP-A3 is simply illustrated.

The first signal line SL1 may include a first portion SL1-1 including a transparent conductive oxide and a second portion SL1-2 connected with the first portion SL1-1 and including metal. The first portion SL1-1 overlaps the first area DP-AL. The first portion SL1-1 may be disposed on the same layer and include the same material as one of the first, second, and third pixel connection lines TWL, TWL1, and TWL2 described with reference to FIG. 7.

The first portion SL1-1 and the second portion SL1-2 may be connected in the second area DP-A2. The first portion SL1-1 and the second portion SL1-2 may overlap in the second area DP-A2. The second portion SL1-2 may be disposed on the same layer and include the same material as the first connection electrode CNE1 or the data line DL in FIG. 7. The second portion SL1-2 may extend to the peripheral area DP-NA through the third area DP-A3. Most of the first signal line SL1 may be occupied by the second portion SL1-2, and a metal having resistance less than the transparent conductive oxide may prevent delay of the driving signal.

Referring to FIG. 9B, the first portion SL1-1 may be disposed on the seventh insulation layer 70. The first pattern CE-P1 may be connected to the first portion SL1-1 through the first contact hole CNT-1 passing through the pixel defining pattern PDP and the eighth insulation layer 80. The first portion SL1-1 may be disposed on the same layer as the first pixel connection line TWL.

The second portion SL1-2 may be disposed on the sixth insulation layer 60. The first portion SL1-1 may be connected to the second portion SL1-2 through the second contact hole CNT-2 passing through the seventh insulation layer 70.

The first signal line SL1 may include a plurality of first portions SL1-1. The plurality of first portions SL1-1 may be respectively connected to different electrode areas EA (refer to FIGS. 8B and 8C).

In FIG. 9C, the first pattern CE-P1 of FIGS. 8B and 8C is simply illustrated. Referring to FIG. 9C, the first signal line SL1 may include on the second portion SL1-2. The first signal line SL1 and the first pattern CE-P1 may be connected in the third area DP-A3. For example, the first signal line SL1 and the first pattern CE-P1 may be connected through the second contact hole CNT-2. The first signal line SL1 may not overlap the first area DP-A1. The first signal line SL1 and the first pattern CE-P1 may be also connected in the second area DP-A2.

Figure 10:
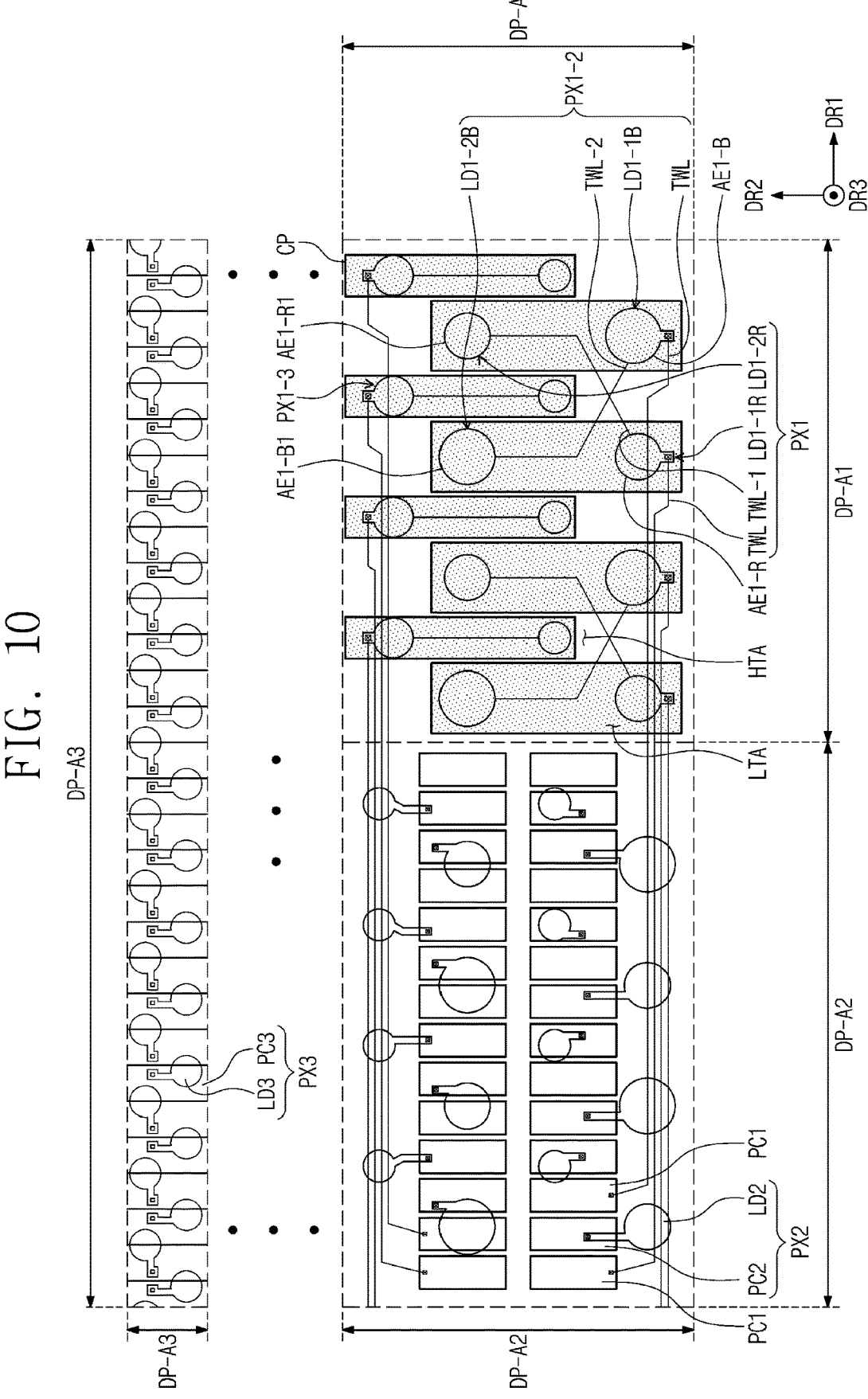
FIG. 10 is an enlarged plan view illustrating the display panel according to an embodiment of the inventive concept.

FIG. 10 is an enlarged plan view illustrating a portion of the display panel DP according to an embodiment of the inventive concept. FIG. 10 illustrates an area corresponding to FIGS. 5C and 8B.

Referring to FIG. 10, the first group pixel PX1 may further include a copy light emitting element LD1-2R, LD1-2B electrically connected with the first light emitting element LD1-1R, LD1-1B. The copy light emitting element LD1-2R, LD1-2B may emit light with the same luminance as the first light emitting element LD1-1R, LD1-1B. The copy light emitting element LD1-2R, LD1-2B may emit light with the same color as the first light emitting element LD1-1R, LD1-1B. The copy light emitting element LD1-2R, LD1-2B may the same laminated structure as the first light emitting element LD1-1R, LD1-1B. In other words, the copy light emitting element LD1-2R, LD1-2B may the same as the first light emitting element LD1-1R, LD1-1B.

Since the copy light emitting element LD1-2R, LD1-2B is disposed on the first area DP-A1 instead of an additional pixel, the number of the first pixel circuits PC1 disposed on the second area DP-A2 may decrease. A degree of freedom of a design of the second area DP-A2 may thus improve. The first area DP-A1 may have a relatively reduced resolution and secure luminance at the same level as the embodiment in FIGS. 5C and 8B.

Two pixels of the first group pixel PX1 will be mainly described in more detail. The first pixel PX1-1 may include a light emitting element LD1-AR having a first color and including the first anode AE1-R and a copy light emitting element LD1-2R having the first color. The second pixel PX1-2 may include a light emitting element LD1-1B having a third color and including the third anode AE1-B and a copy light emitting element LD1-2B having the third color.

The first anode AE1-R of the light emitting element D1-1R having the first color and an anode AE1-R1 of the copy light emitting element LD1-2R having the first color may be connected through a first connection line TWL-1. The third anode AE1-B of the light emitting element LD1-1B having the third color and an anode AE1-B1 of the copy light emitting element LD1-2B having the third color may be connected through a second connection line TWL-2.

The first connection line TWL-1 and the second connection line TWL-2 may cross each other. For example, the first connection line TWL-1 and the second connection line TWL-2 may cross each other in a high transmittance area HTA. The first connection line TWL-1 may be disposed on the same layer and include the same material as one of the first, second, and third connection lines TWL, TWL1, and TWL2 described with reference to FIG. 7, and the second connection line TWL-2 may be disposed on the same layer and include the same material as another of the first, second, and third connection lines TWL, TWL1, and TWL2 described with reference to FIG. 7. A portion of each of the first connection line TWL-1 and the second connection line TWL-2 may overlap the high transmittance area HTA that will be described later.

A cathode of the light emitting element LD1-IR having the first color and a cathode of the light emitting element LD1-2B having the third color may have an integrated shape, and a cathode of the light emitting element LD1-1B having the third color and a cathode of the light emitting element LD1-2R having the first color may have an integrated shape. In addition, a cathode of the copy light emitting element LD1-2 and a cathode of the first light emitting element LD1-1 of the third pixel PX1-3 may have an integrated shape.

The first pattern CE-P1 may include a plurality of portions CP. One portion CP may correspond to the cathode of each of one first light emitting element LD1-1R and LD1-1B and one copy light emitting element LD1-2R and LD1-2B.

An area on which the plurality of portions CP are disposed corresponds to the low transmittance area LTA, and an area on which the plurality of portions CP are not disposed corresponds to the high transmittance area HTA. Although the plurality of portions CP that are spaced apart from each other are illustrated as an example in FIG. 10, the inventive concept is not limited thereto. The plurality of portions CP may have an integrated shape through the connection areas CNA in FIG. 8C or electrically connected through the cathode connection lines CTWL in FIG. 8E. The plurality of portions CP may be connected to the signal line SL1 as described with reference to FIGS. 9A and 9C.

Figure 11A:
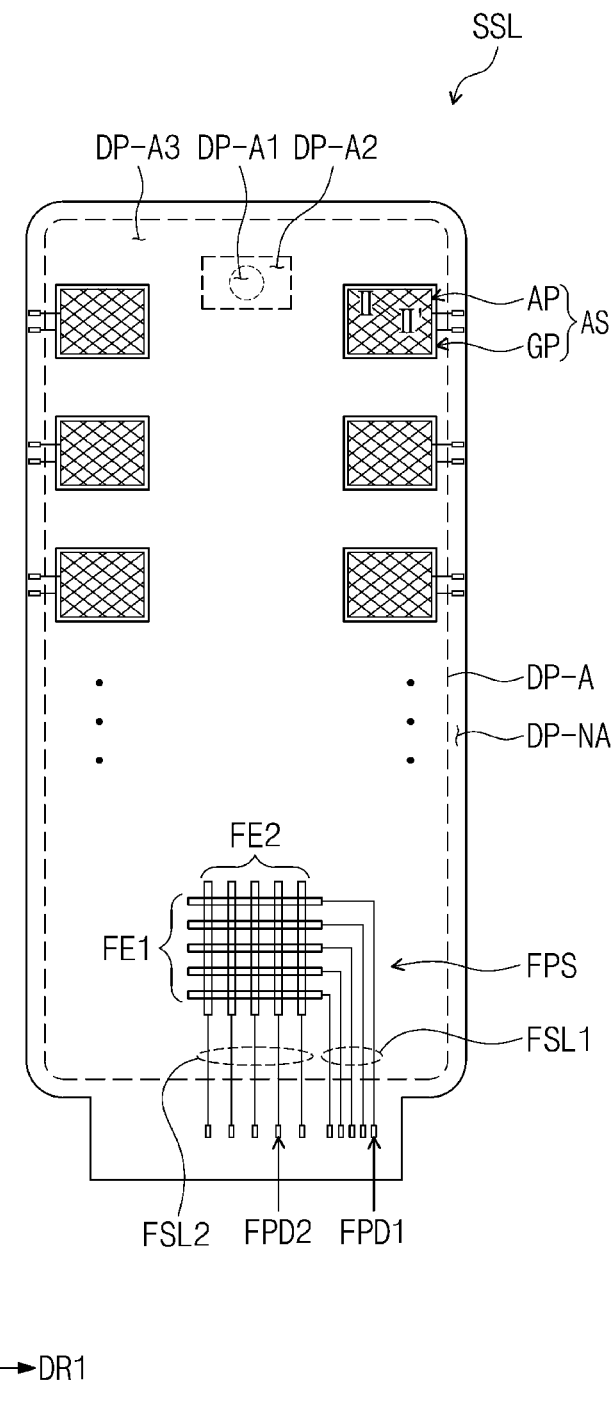
FIG. 11A is a plan view illustrating a sensor layer according to an embodiment of the inventive concept.
Figure 11B:
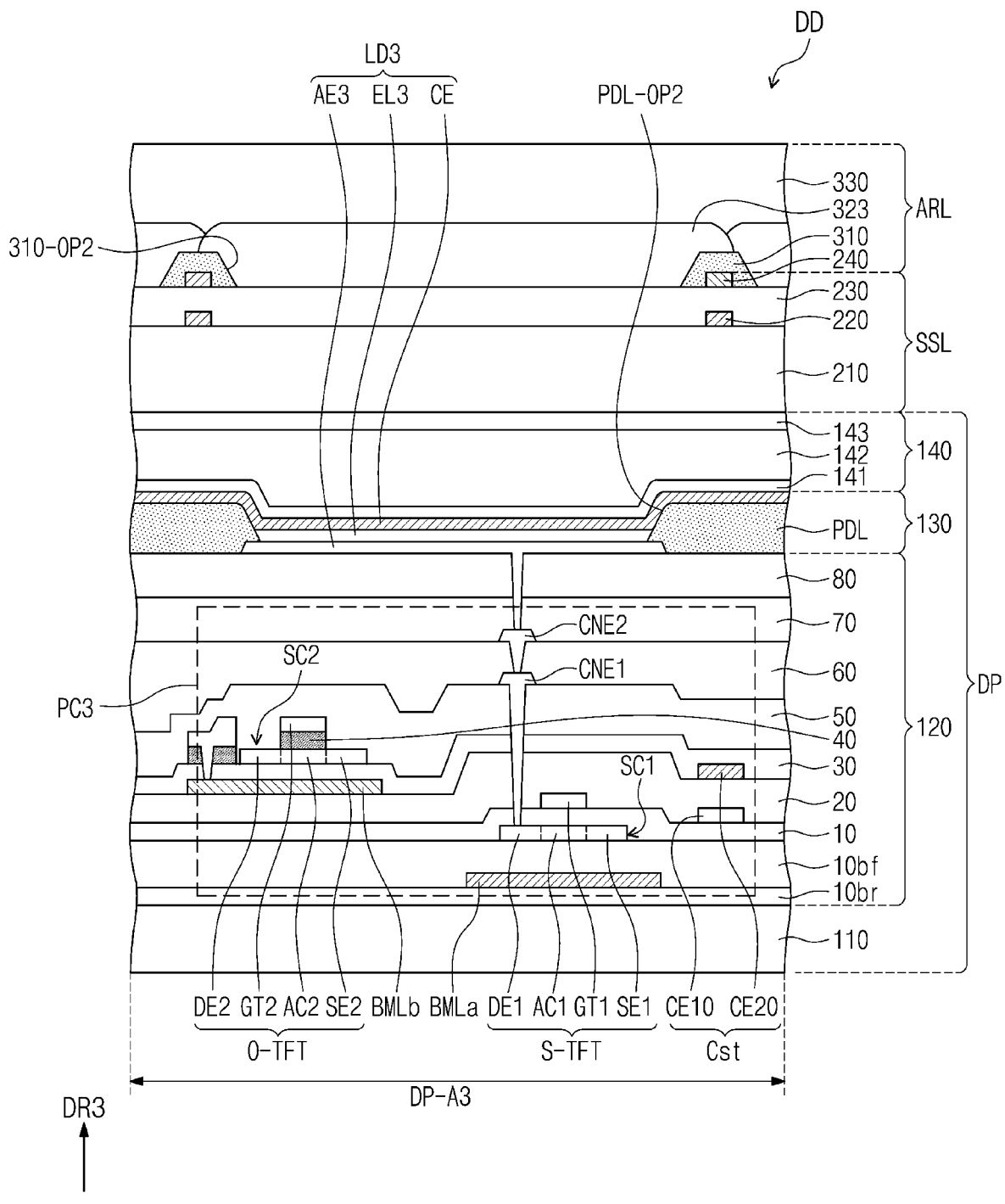
FIG. 11B is a cross-sectional view taken long line I-III' of FIG. 11A.
Figure 11C:
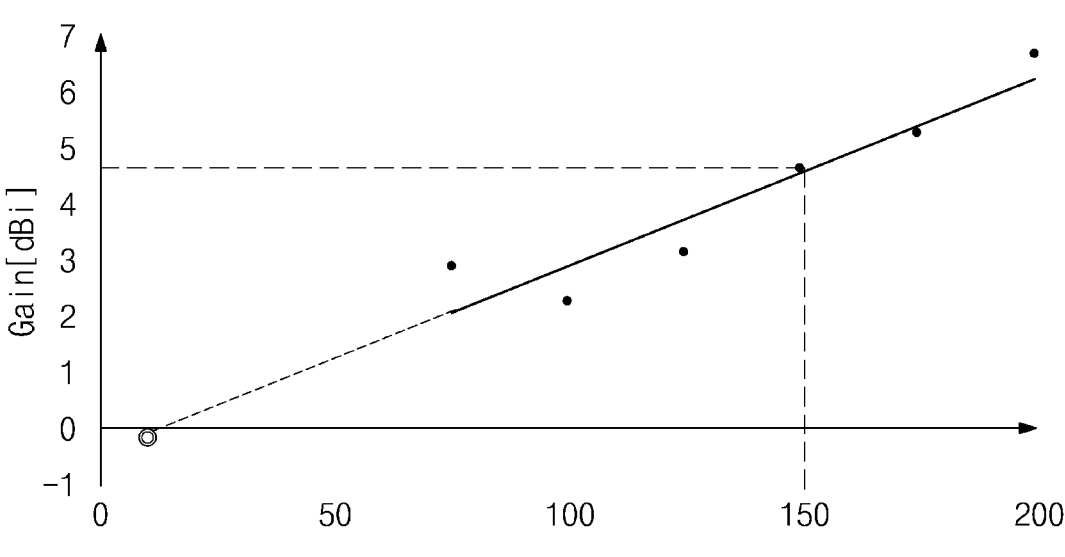
FIG. 11C is a graph representing a gain value according to a distance between a cathode and an antenna pattern.
Figure 11D:
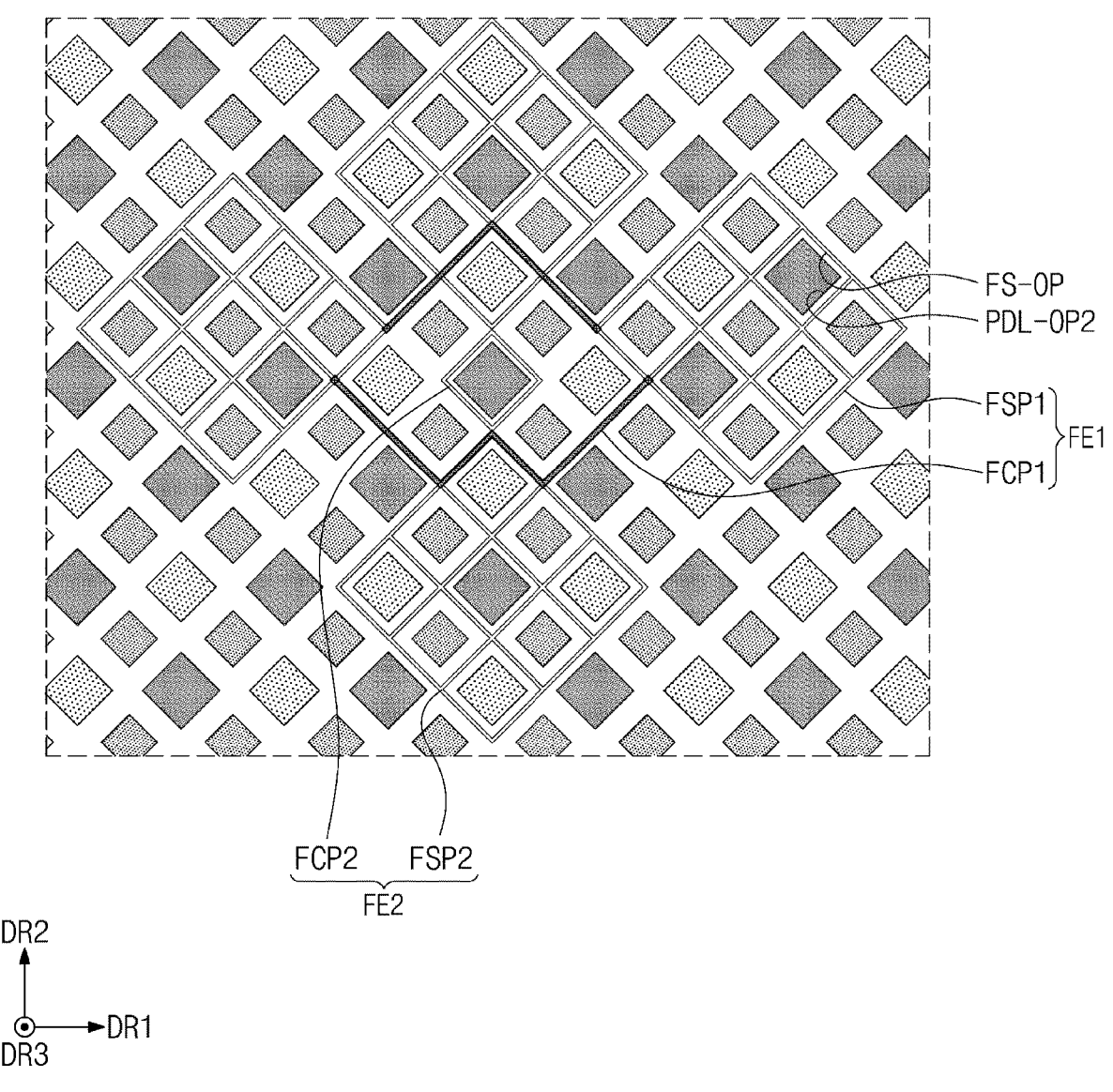
FIG. 11D is an enlarged plan view illustrating a fingerprint sensor according to an embodiment of the inventive concept.

FIG. 11A is a plan view illustrating the sensor layer SSL according to an embodiment of the inventive concept. FIG. 11B is a cross-sectional view taken long line III-III' of FIG. 11A. FIG. 11C is a graph representing a gain value according to a distance between the cathode CE and an antenna pattern AP. FIG. 11D is an enlarged plan view illustrating a fingerprint sensor FPS according to an embodiment of the inventive concept.

Referring to FIG. 11A, the sensor layer SSL may include at least one of an antenna sensor AS and a fingerprint sensor FPS. As described above, since the cathode may be used as the input sensor, the antenna sensor AS and the fingerprint sensor FPS may be provided by the sensor layer SSL.

In general, the antenna sensor AS is manufactured to have a module shape and mounted into the electronic device 1000 in FIG. 2A. For example, the antenna sensor AS may be mounted to the electronic device 1000 in the form of the wireless communication module E-20. Particularly, the antenna sensor AS may be disposed to face a side surface of the housing HM, which may generate a limitation on designing of the electronic device 1000. According to this embodiment, the antenna sensor AS may be disposed on the sensor layer SSL to replace the module type antenna sensor.

In addition, the fingerprint sensor FPS is manufactured to have a module shape and mounted into the electronic device 1000 in FIG. 2A. The fingerprint sensor FPS may be aligned to an opening provided in a rear surface of the housing HM and exposed to the outside of the housing HM, which may result in a limitation on designing the electronic device 1000. According to this embodiment, the fingerprint sensor FPS may be disposed on the sensor layer SSL to replace the module type fingerprint sensor. As the additional modules are omitted, an arrangement space of the power module PSM in the housing HM may increase.

Referring to FIG. 11A, six antenna sensors AS are illustrated as an example. Although the patch antenna sensor AS is illustrated as an example in FIG. 11A, the inventive concept is not limited to the antenna sensor AS. The antenna sensor AS may include an antenna pattern AP and a ground pattern GP. The antenna pattern AP may receive a driving voltage having a predetermined level, and the ground pattern GP may receive a ground voltage.

The antenna pattern AP and the ground pattern GP may not be disposed on the first area and the second area DP-A1 and DP-A2. The antenna pattern AP and the ground pattern GP may have a mesh shape. An opening corresponding to the second opening PDL-OP2 of FIG. 11B may be provided in each of the antenna pattern AP and the ground pattern GP.

The antenna pattern AP may be provided from the second conductive layer 240 of FIG. 11B, and the ground pattern GP may be provided from the first conductive layer 220 of FIG. 11B.

Referring to FIG. 11B, a thickness of the first insulation layer 210 may be controlled to secure a distance between the cathode CE and each of the antenna pattern AP and the ground pattern GP. The first insulation layer 210 may be an organic layer having a thickness of about 150 μm or more.

Referring to FIG. 11C, when the distance between the antenna sensor AS and the cathode CE is equal to or greater than about 150 μm, the gain value may be about 4 dB to about dB. A characteristic of the antenna sensor AS may be secured when the gain value is in a range from about 4 dB to about 5 dB. The distance of about 150 μm or more between the antenna sensor AS and the cathode CE may be secured by controlling the thickness of the first insulation layer 210. The distance between the antenna sensor AS and the cathode CE is measured by the distance between the ground pattern GP and the cathode CE.

Referring to FIG. 11A, the fingerprint sensor FPS may include a first group electrode FE1 and a second group electrode FE2. The first group electrode FE1 is connected to a first signal line FSL1, and the second group electrode FE2 is connected to a second signal line FSL2. The first signal line FSL1 is connected to a first pad FPD1 connected to the flexible circuit board FCB in FIG. 2A, and the second signal line FSL2 is connected to a second pad FPD2 connected to the flexible circuit board FCB in FIG. 2A.

FIG. 11D is a view illustrating a crossing area of the first group electrode FE1 and the second group electrode FE2 as an example. The first group electrode FEI includes first sensing patterns FSP1 spaced apart from each other in the first direction DR1 and a first connection pattern FCP1 for connecting the first sensing patterns FSP1. Two first connection patterns FCP1 are illustrated as an example. The second group electrode FE2 includes second sensing patterns FSP2 spaced apart from each other in the second direction DR2 and a second connection pattern FCP2 for connecting the second sensing patterns FSP2.

The first sensing patterns FSP1, the second sensing patterns FSP2, and the second connection pattern FCP2 may be provided from the second conductive layer 240 in FIG. 11B, and the first connection pattern FCP1 may be provided from the first conductive layer 220 in FIG. 11B. The first connection pattern FCP1 may be connected to the first sensing patterns FSP1 through a contact hole passing through the second insulation layer 230. The second sensing patterns FSP2 and the second connection pattern FCP2 may have an integrated shape.

Each of the first sensing patterns FSP1 and the second sensing patterns FSP2 may have a maximum width of about 50 μm to about 150 μm. In this embodiment, the maximum width may be measured in a diagonal line of the first sensing patterns FSP1 and the second sensing patterns FSP2.

The first sensing patterns FSP1 and the second sensing patterns FSP2 correspond to a fingerprint sensing pattern. The fingerprint sensing pattern may have a maximum width of about 100 μm to about 200 μm that is a distance between ridges of a fingerprint.

Each of the first sensing patterns FSP1 and the second sensing patterns FSP2 may have a mesh shape. An opening FS-OP corresponding to the second opening PDL-OP2 may be provided in each of the first sensing patterns FSP1 and the second sensing patterns FSP2. The second opening PDL-OP2 may have a maximum width of about 50 μm. The first sensing patterns FSP1 and the second sensing patterns FSP2, in which the second openings PDL-OP2 arranged in a 3×3 array in one sensing pattern FSP1 and FSP2 are illustrated as an example.

Figure 12A:
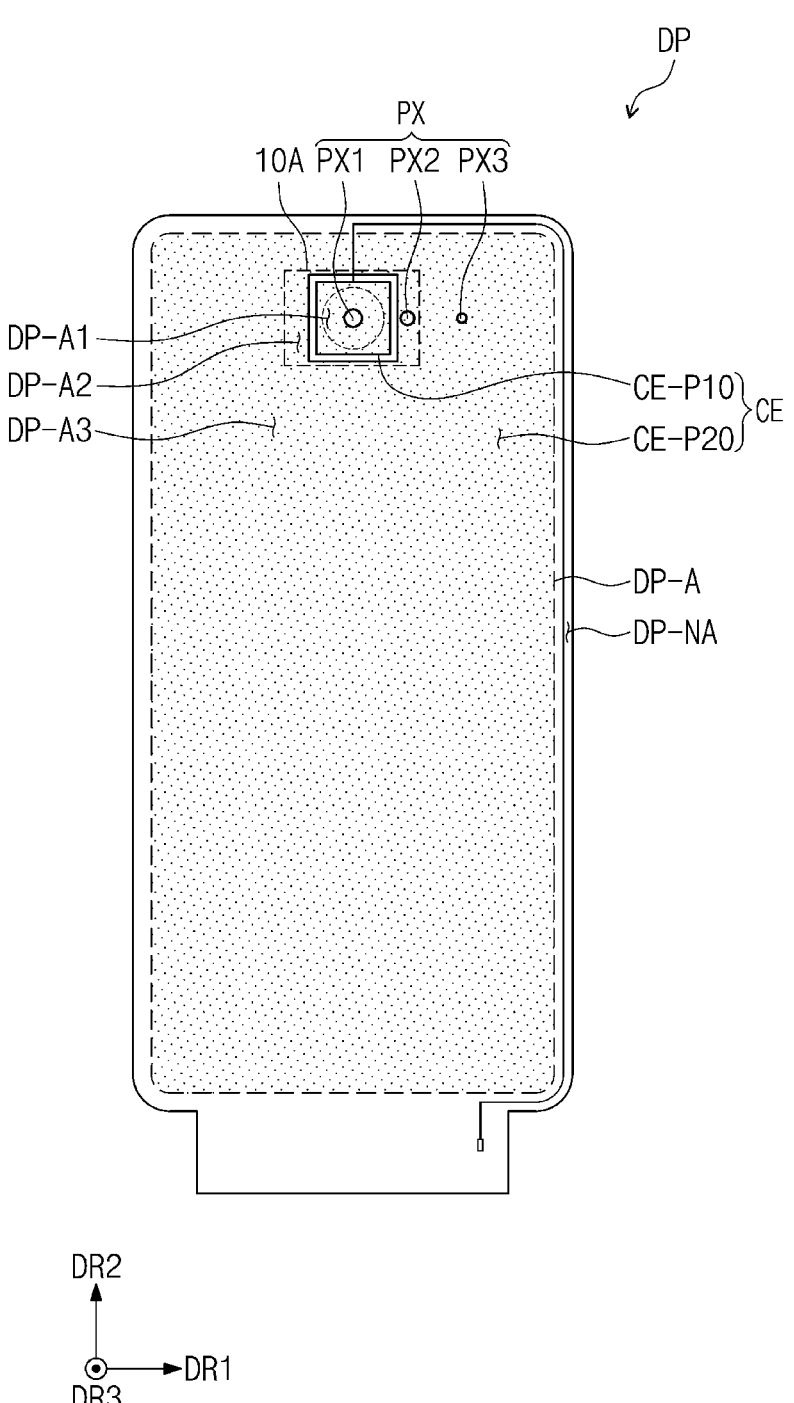
FIG. 12A is a plan view illustrating a cathode of the display panel according to an embodiment of the inventive concept.
Figure 12B:
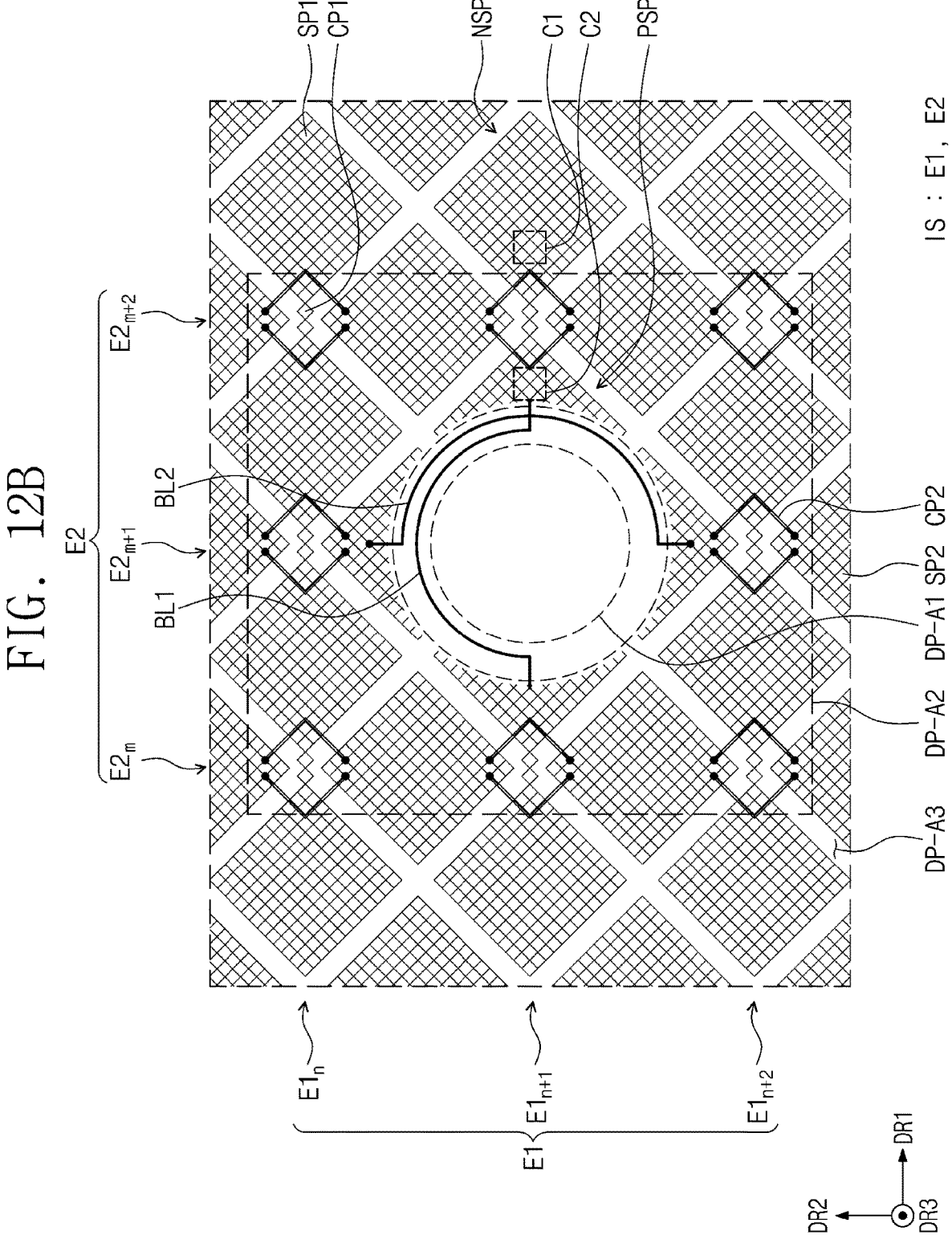
FIG. 12B is a plan view illustrating an input sensor according to an embodiment of the inventive concept.
Figure 12C:
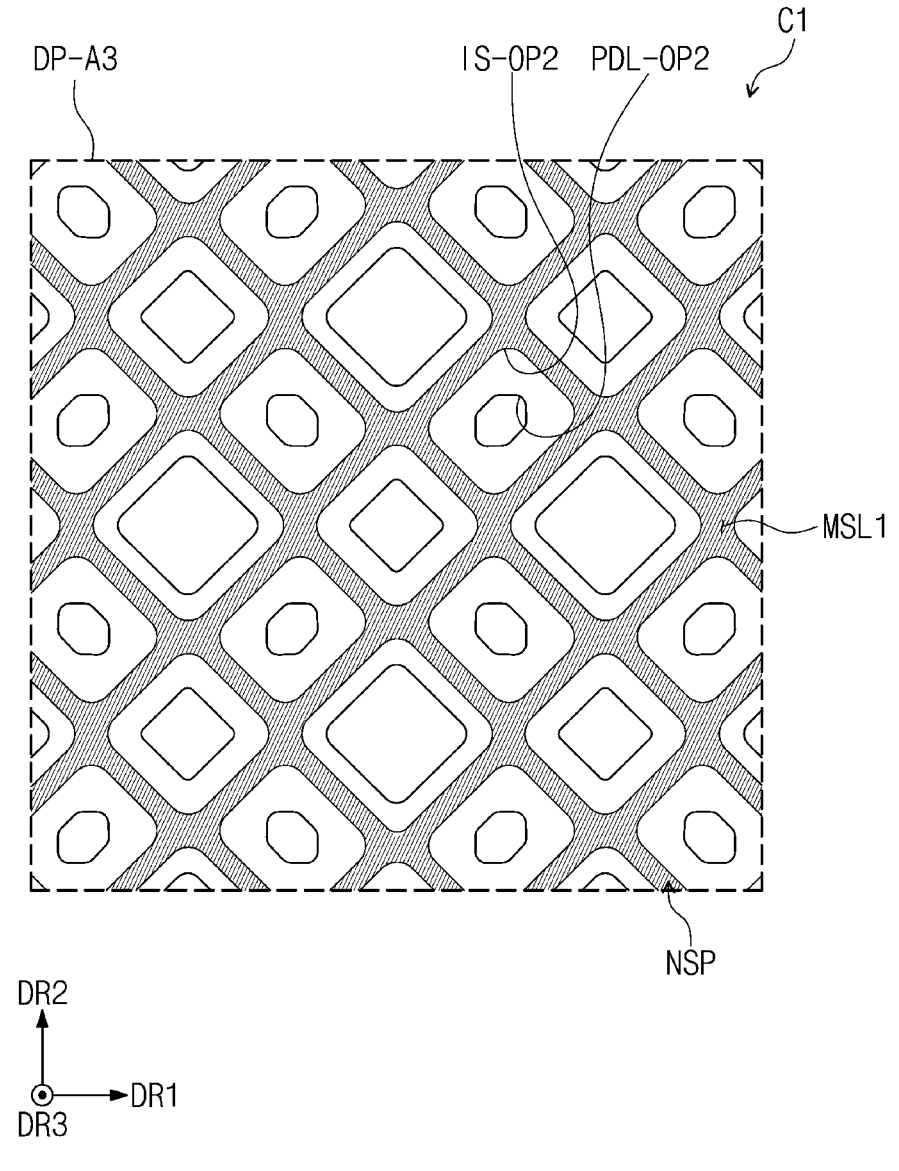
FIG. 12C is an enlarged plan view illustrating a normality sensing pattern of the input sensor according to an embodiment of the inventive concept.
Figure 12D:
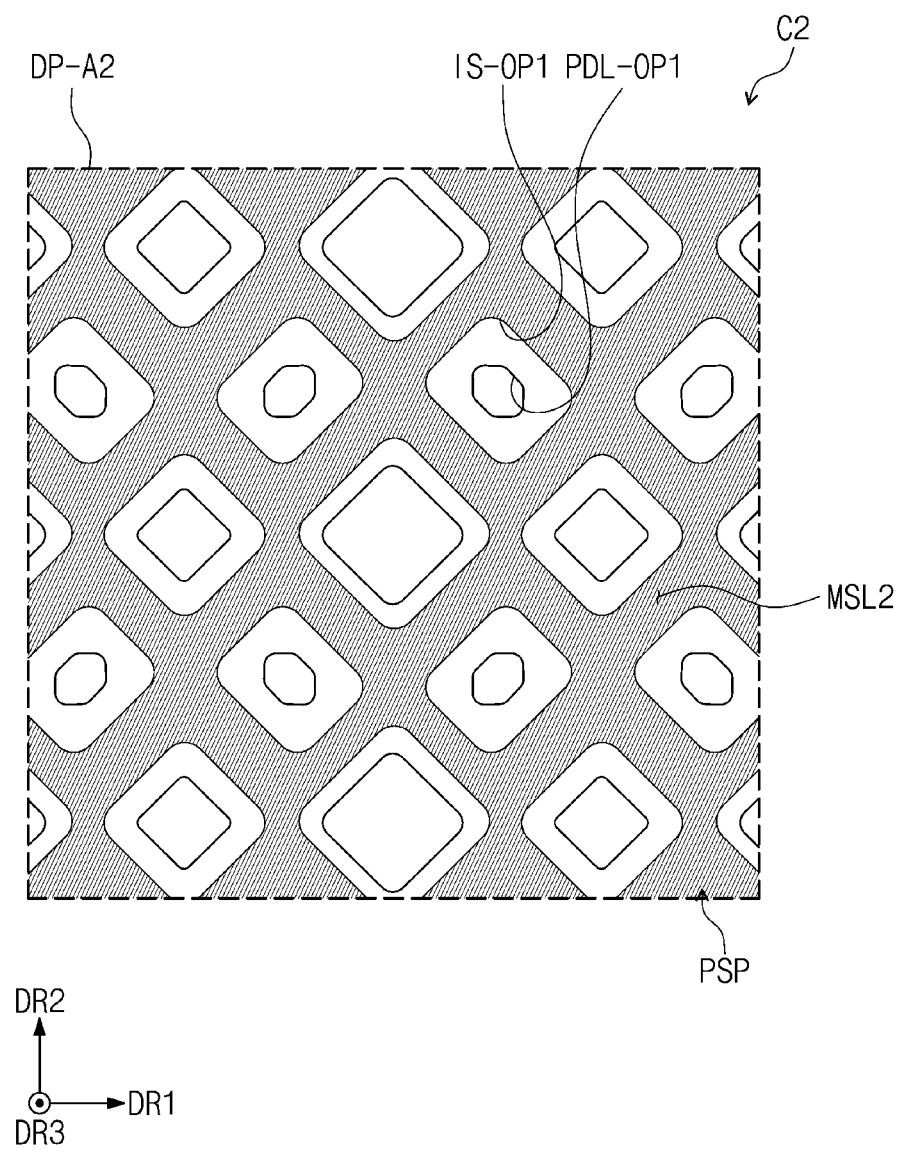
FIG. 12D is an enlarged plan view illustrating a partial sensing pattern of the input sensor according to an embodiment of the inventive concept.

FIG. 12A is a plan view illustrating the cathode CE of the display panel DP according to an embodiment of the inventive concept. FIG. 12B is a plan view illustrating the input sensor according to an embodiment of the inventive concept. FIG. 12C is an enlarged plan view illustrating a normality sensing pattern NSP of the input sensor IS according to an embodiment of the inventive concept. FIG. 12D is an enlarged plan view illustrating a portion sensing pattern PSP of the input sensor IS according to an embodiment of the inventive concept.

As illustrated in FIG. 12A, the cathode CE may include a first pattern CE-P10 and a second pattern CE-P20. The first pattern CE-P10 corresponds to the first pattern CE-P1 in FIG. 8A. The second pattern CE-P20 is spaced apart from the first pattern CE-P10 and overlaps an area that does not overlap the first pattern CE-P10. The second pattern CE-P20 receives only the second power voltage ELVSS during the first period T10 (refer to FIG. 4B) and the second period T20 (refer to FIG. 4B).

Referring to FIG. 12B, the input sensor IS may be provided from the sensor layer SSL (refer to FIGS. 3 and 6). However, the conductive pattern of the input sensor is not disposed on the first area DP-A1 to increase the transmittance of the first area DP-A1. An input to the first area DP-AJ may be detected through the first pattern CE-P10 in FIG. 12A.

The input sensor IS may include a first group electrode E1, a second group electrode E2, and a signal line connected thereto. The first group electrode E1 and the second group electrode E2 may be alternately driven in a mutual cap (or mutual capacitance) method. In FIG. 12A, n-th to n+2-th first electrodes E1$n$ to E1$n$+2 of the first group electrode E1 and m-th to m+2-th second electrodes E2$m$ to E2$m$+2 of the second group E2 are illustrated. Here, n and m are natural numbers equal to or greater than 1.

The first group electrode FE1 includes first sensing patterns SPI spaced apart from each other in the first direction DR1 and a first connection pattern CP1 for connecting the first sensing patterns SPI. One first connection pattern CP1 is illustrated as an example. The second group electrode FE2 includes second sensing patterns SP2 spaced apart from each other in the second direction DR2 and a second connection pattern CP2 for connecting the second sensing patterns SP2. Two second connection patterns CP2 are illustrated as an example.

The first sensing patterns SPI, the second sensing patterns SP2, and the first connection pattern CPI may be provided from the second conductive layer 240 in FIG. 6, and the second connection pattern CP2 may be provided from the first conductive layer 220 in FIG. 6. The second connection pattern CP2 may be connected to the second sensing patterns SP2 through a contact hole passing through the second insulation layer 230. The first sensing patterns SP1 and the first connection pattern CPI may have an integrated shape.

The n-th to n+2-th first electrodes E1$n$ to E1$n$+2 and the m-th to m+2-th second electrodes E2$m$ to E2$m$+2 are disposed around the first area DP-A1. The first sensing patterns SP1 and the second sensing patterns SP2 correspond to the sensing pattern of the input sensor IS. The sensing pattern of the input sensor IS may include the normality sensing pattern NSP and the portion sensing pattern PSP.

The portion sensing pattern PSP may be disposed around the first area DP-A1 and have a shape that is partially removed from the normality sensing pattern NSP so that the sensing pattern of the input sensor IS is not disposed on the first area DP-A1. As the portion sensing pattern PSP replaces the normality sensing pattern NSP overlapping the first area DP-A1, the transmittance of the first area DP-A1 may increase.

The portion sensing pattern PSP of the n+I-th first electrode E1$n$+1 may be connected through a first dummy connection line BL1, and the portion sensing pattern PSP of the m+I-th second electrode E2$m$+1 may be connected through a second dummy connection line BL2. The first dummy connection line BL1 and the second dummy connection line BL2, which cross each other, may be disposed on different layers.

Referring to FIGS. 12C and 12D, each of the normality sensing pattern NSP and the portion sensing pattern PSP may have a mesh shape. Each of the normality sensing pattern NSP and the portion sensing pattern PSP includes a conductive line MSL1 and MSL2. The conductive line MSL1 of the normality sensing pattern NSP and the conductive line MSL2 of the portion sensing pattern PSP of the third area DP-A3 may have different line widths. An opening IS-OP2 corresponding to the second opening PDL-OP2 (refer to FIG. 6) may be provided in the normality sensing pattern NSP. An opening IS-OP1 corresponding to the first opening PDL-OP1 (refer to FIG. 7) may be provided in the portion sensing pattern PSP.

When FIGS. 12C and 12D are compared, the number of the second opening PDL-OP2 of the third area DP-A3 is greater than that of the first opening PDL-OP1 of the second area DP-A2. This is because the third area DP-A3 has a resolution greater than that of the second area DP-A2.

Since a width between the first openings PDL-OP1 in the second area DP-A2 is relatively great, a line width of the conductive line MSL2 of the portion sensing pattern PSP may be greater than that of the conductive line MSL1 of the normality sensing pattern NSP disposed on the third area DP-A3. As illustrated in FIG. 12B, a mutual capacitance of the portion sensing pattern PSP, which is reduced as an area thereof decreases, may be compensated by increasing the line width of the conductive line MSL2.

According to the above descriptions, as the cathode overlapping the sensing area is patterned, the transmission efficiency of the optical signal may increase.

The cathode overlapping the sensing area may be used as the electrode of the input sensor. Thus, the input sensor overlapping the sensing area may be omitted. Resultantly, the transmittance of the sensing area may increase.

Since the cathode is used as the input sensor, another sensor may be provided on the display panel. For example, the antenna sensor or the fingerprint sensor may be integrated with the display panel. Since the antenna sensor or the fingerprint sensor, which is separately manufactured, is omitted, the electronic device may be slimmed, and the space usage efficiency of the electronic device may increase.

While embodiments of the inventive concept have been described, those skilled in the art will understand that the inventive concept may be variously modified and changed. Therefore, the disclosed subject matter should not be limited to the embodiments described herein.

What is claimed is:

1. A display device, comprising:
a display panel comprising:
a base layer comprising a display area comprising a first area through which an optical signal passes and a second area disposed adjacent to the first area, surrounding the first area, and configured to block the optical signal, and a peripheral area disposed adjacent to the display area; and
a first group pixel and a second group pixel disposed on the base layer,
wherein the first group pixel comprises a first pixel and a second pixel, the first pixel comprises a first-first light emitting element disposed on the first area and a first-first pixel circuit electrically connected to the first-first light emitting element and disposed on the second area or the peripheral area, and the second pixel comprises a first-second light emitting element disposed on the first area and a first-second pixel circuit electrically connected to the first-second light emitting element and disposed on the second area or the peripheral area,
the first-first light emitting element comprises a first-first anode, a first-first light emitting layer disposed on the first-first anode, and a first-first cathode disposed on the first-first light emitting layer,
the first-second light emitting element comprises a first-second anode, a first-second light emitting layer disposed on the first-second anode, and a first-second cathode disposed on the first-second light emitting layer,
the first-first cathode and the first-second cathode are electrically connected,
the first area comprises a first-first area overlapping the first-first cathode and the first-second cathode and a first-second area that does not overlap the first-first cathode and the first-second cathode, and
the first-first cathode and the first-second cathode receives a power voltage during a first period and receives a driving signal during a second period.

2. The display device of claim 1, wherein the second group pixel comprises a second light emitting element disposed on the second area and a second pixel circuit electrically connected to the second light emitting element and disposed on the second area,
the second light emitting element comprises an anode, a light emitting layer disposed on the anode, and a cathode disposed on the light emitting layer, and
the cathode of the second light emitting element and the first-first cathode of the first-first light emitting element are electrically connected to each other.

3. The display device of claim 2, wherein the cathode of the second light emitting element and the first-first cathode of the first-first light emitting element have an integrated shape.

4. The display device of claim 1, wherein the first-first cathode of the first-first light emitting element and the first-second cathode of the first-second light emitting element have an integrated shape.

5. The display device of claim 1, wherein the first-first light emitting element further comprises an electron transport layer disposed between the first-first light emitting layer and the first-first cathode, and
the electron transport layer overlaps the first area and does not overlap the second area.

6. The display device of claim 1, wherein the display panel further comprises a cathode connection line configured to connect the first-first cathode of the first-first light emitting element and the first-second cathode of the first-second light emitting element, and
the cathode connection line comprises a transparent conductive oxide and overlaps the second area.

7. The display device of claim 1, wherein the display panel further comprises a signal line configured to provide the power voltage and the driving signal to the first-first cathode of the first-first light emitting element.

8. The display device of claim 7, wherein the signal line comprises:

a first portion overlapping the first area and comprising a transparent conductive oxide; and a second portion overlapping the second area, connected with the first portion, and comprising metal.

9. The display device of claim 8, wherein the first-first pixel circuit comprises a transistor electrically connected to a data line, and the second portion comprises a same material as the data line and is disposed on a same layer as the data line.

10. The display device of claim 8, wherein the display panel further comprises a pixel connection line configured to connect the first-first light emitting element and the first-first pixel circuit, and the first portion comprises a same material as the pixel connection line and is disposed on a same layer as the pixel connection line.

11. The display device of claim 8, wherein the display panel further comprises an organic layer configured to expose the first-first anode of the first pixel, and the first-first cathode of the first pixel is disposed on the organic layer and connected to the first portion through a first contact hole passing through the organic layer.

12. The display device of claim 11, wherein the first portion and the second portion are disposed on different layers with an insulation layer therebetween, and the first portion and the second portion are connected through a second contact hole passing through the insulation layer.

13. The display device of claim 1, wherein the first pixel further comprises a first copy light emitting element electrically connected with the first-first light emitting element, the first copy light emitting element comprises an anode, a light emitting layer disposed on the anode, and a cathode disposed on the light emitting layer, wherein the second pixel further comprises a second copy light emitting element electrically connected with the first-second light emitting element, the second copy light emitting element comprises an anode, a light emitting layer disposed on the anode, and a cathode disposed on the light emitting layer, the first-first cathode of the first-first light emitting element of the first pixel and the cathode of the second copy light emitting element of the second pixel have an integrated shape, and the cathode of the first-second light emitting element of the second pixel and the cathode of the first copy light emitting element of the first pixel have an integrated shape.

14. The display device of claim 13, wherein the display panel further comprises:

a first connection line configured to connect the first-first anode of the first-first light emitting element of the first pixel and the anode of the first copy light emitting element of the first pixel; and a second connection line configured to connect the first-second anode of the first-second light emitting element of the second pixel and the anode of the second copy light emitting element of the second pixel, and the first connection line and the second connection line cross each other and are disposed on different layers.

15. The display device of claim 14, wherein each of the first connection line and the second connection line comprises a transparent conductive oxide, and a portion of each of the first connection line and the second connection line overlaps the second area.

16. The display device of claim 1, wherein the base layer further comprises a third area disposed between the peripheral area and the second area, the display panel further comprises a third group pixel disposed on the third area, the third group pixel comprises a third light emitting element disposed on the third area and a third pixel circuit electrically connected to the third light emitting element and disposed on the third area, the third light emitting element comprises an anode, a light emitting layer disposed on its anode, and a cathode disposed on its light emitting layer, and the cathode of the third light emitting element receives the power voltage during the first period and the driving signal during a third period.

17. The display device of claim 16, wherein the third group pixel comprises a third pixel and a fourth pixel, the cathode of the third pixel is electrically connected with the first-first cathode of the first pixel, and the cathode of the fourth pixel is electrically separated from the first-first cathode of the first pixel.

18. The display device of claim 1, further comprising a sensor disposed on the display panel, wherein the display panel further comprises an encapsulation layer configured to cover the first-first light emitting element, and the sensor is disposed on the encapsulation layer.

19. The display device of claim 18, wherein the sensor comprises an antenna pattern.

20. The display device of claim 19, wherein the base layer further comprises a third area disposed between the peripheral area and the second area, the display panel further comprises a third group pixel disposed on the third area, the third group pixel comprises a third light emitting element disposed on the third area and a third pixel circuit electrically connected to the third light emitting element and disposed on the third area, the third light emitting element comprises an anode, a light emitting layer disposed on its anode, and a cathode disposed on its light emitting layer, the antenna pattern overlaps the third area, and a distance between the antenna pattern and the cathode of the third light emitting element is equal to or greater than about 150 μm.

21. The display device of claim 18, wherein the sensor comprises a fingerprint sensing pattern, and the fingerprint sensing pattern has a width of about 50 μm to about 150 μm.

22. The display device of claim 18, wherein the base layer further comprises a third area disposed between the peripheral area and the second area, the display panel further comprises a third group pixel disposed on the third area, the sensor comprises a sensing pattern of an input sensor, the sensing pattern of the input sensor comprises:

a first sensing pattern overlapping the third area; and a second sensing pattern that does not overlap the first area, overlaps the second area, and has an area less than that of the first sensing pattern.

23. The display device of claim 22, wherein each of the first sensing pattern and the second sensing pattern comprises a conductive line configured to form a plurality of openings, and the conductive line of the second sensing pattern has a line width greater than that of the conductive line of the first sensing pattern.

24. An Electronic device including a display device, comprising:

a display panel comprising:

a base layer comprising a display area comprising a first area and a second area disposed adjacent to the first area, and a peripheral area disposed adjacent to the display area; and a first group pixel and a second group pixel disposed on the base layer, wherein the first group pixel comprises a first pixel and a second pixel, the first pixel comprises a first-first light emitting element disposed on the first area and a first-first pixel circuit electrically connected to the first-first light emitting element and disposed on the second area or the peripheral area, the second pixel comprises a first-second light emitting element disposed on the second area and a first-second pixel circuit electrically connected to the first-second light emitting element and disposed on the second area or the peripheral area, the first-first light emitting element comprises a first-first anode, a first-first light emitting layer disposed on the first-first anode, and a first-first cathode disposed on the first-first light emitting layer, the first-second light emitting element comprises a first-second anode, a first-second light emitting layer disposed on the first-second anode, and a first-second cathode disposed on the first-second light emitting layer and electrically connected to the first-first cathode, and each of the first-first cathode and the first-second cathode receives a power voltage during a first period and receives a driving signal during a second period.

\* \* \* \* \*